(12) United States Patent
Kamikawa et al.

(10) Patent No.: US 6,698,439 B2
(45) Date of Patent: Mar. 2, 2004

(54) PROCESSING APPARATUS WITH SEALING MECHANISM

(75) Inventors: Yuji Kamikawa, Tosu (JP); Koji Egashira, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 42 days.

(21) Appl. No.: 09/912,412

(22) Filed: Jul. 2, 2001

(65) Prior Publication Data

US 2002/0053367 A1 May 9, 2002

(30) Foreign Application Priority Data

Jul. 3, 2000 (JP) .......................................... 2000-200452
Aug. 29, 2000 (JP) .......................................... 2000-259647

(51) Int. Cl.⁷ ................................................ B08B 3/02
(52) U.S. Cl. .................... 134/138; 134/153; 134/200; 134/902; 49/477.1; 277/34
(58) Field of Search ................................ 134/148, 157, 134/153, 902, 200; 49/477.1; 277/34, 39.3, 34.6

(56) References Cited

U.S. PATENT DOCUMENTS

| | | | |
|---|---|---|---|
| 2,284,243 A | * | 5/1942 | Zimark |
| 2,527,084 A | * | 10/1950 | Smith |
| 2,691,460 A | * | 10/1954 | Barnebey |
| 2,836,186 A | * | 5/1958 | Guth |
| 3,169,540 A | * | 2/1965 | Moore et al. |
| 3,169,541 A | * | 2/1965 | Cushing |
| 3,178,779 A | * | 4/1965 | Clark et al. |
| 3,240,038 A | * | 3/1966 | Schwegler |
| 3,341,974 A | * | 9/1967 | Ganzinotti |
| 3,371,986 A | * | 3/1968 | Brown |
| 3,678,624 A | * | 7/1972 | Bicicchi |
| 3,994,103 A | * | 11/1976 | Ouellet |
| 4,108,601 A | * | 8/1978 | Wolff |
| 4,335,075 A | * | 6/1982 | Kackos |
| 4,579,192 A | * | 4/1986 | Mueller |
| 4,650,542 A | * | 3/1987 | Ash |
| 4,671,326 A | * | 6/1987 | Wilhelm et al. |
| 4,993,722 A | * | 2/1991 | Gundy |
| 4,999,165 A | * | 3/1991 | Calabra et al. |

(List continued on next page.)

*Primary Examiner*—Frankie L. Stinson
(74) *Attorney, Agent, or Firm*—Smith, Gambrell & Russell, LLP

(57) ABSTRACT

A processing apparatus includes an inner cylinder 25 (a processing chamber 23) accommodated in a carrying unit for carrying an object to be processed and further seals up the object with the inner cylinder 25 or a first stationary wall 34 to process the object in contact with processing fluid. In this processing apparatus with sealing mechanism, flexible hollow packings 100, 101 are arranged doubly in either the inner cylinder 25 or the first stationary wall 34, at its occluded part with the first stationary wall 34 and the inner cylinder 25. The hollow packings 100, 101 have their hollow parts 102 connected with respective pressurized-air sources 103 through pressure-detecting switches 110 and closing valves 105. By expanding or contracting the hollow packings 100, 101, the operation of the apparatus is switched in between its sealing state and non-sealing state. With this arrangement, it is possible to improve the sealing capability and prolong the life of the mechanism.

24 Claims, 25 Drawing Sheets

U.S. PATENT DOCUMENTS

| | | | |
|---|---|---|---|
| 5,022,419 A | * | 6/1991 | Thompson et al. |
| 5,029,595 A | * | 7/1991 | Hautau |
| 5,098,245 A | * | 3/1992 | Toro-Lira et al. |
| 5,150,543 A | * | 9/1992 | Wessipe et al. |
| 5,174,045 A | | 12/1992 | Thompson et al. |
| 5,232,328 A | | 8/1993 | Owczarz et al. |
| 5,302,120 A | | 4/1994 | Durado |
| 5,449,289 A | | 9/1995 | Owczarz et al. |
| 5,826,496 A | * | 10/1998 | Jara |
| 5,837,059 A | * | 11/1998 | Glants |
| 5,882,589 A | * | 3/1999 | Mariotti |
| 5,906,435 A | * | 5/1999 | Callagahan et al. |
| 6,048,493 A | * | 4/2000 | Melgaard et al. |
| 6,085,940 A | * | 7/2000 | Ferri, Jr. |
| 6,098,992 A | * | 8/2000 | Long et al. |
| 6,125,591 A | * | 10/2000 | Schmidhuber et al. |
| 6,176,934 B1 | * | 1/2001 | Nelson |
| 6,347,918 B1 | * | 2/2002 | Blahnik |

* cited by examiner

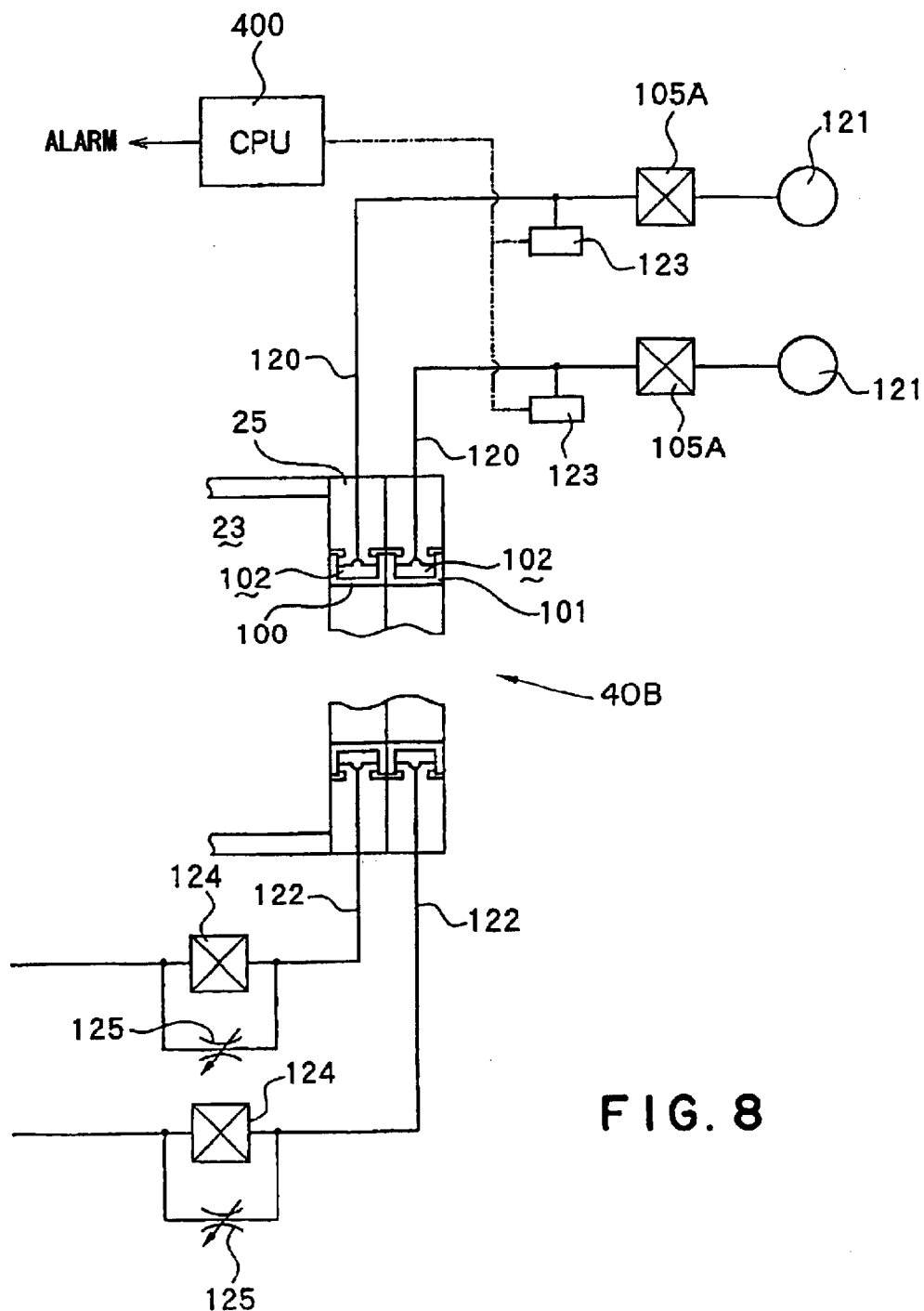
F I G. 8

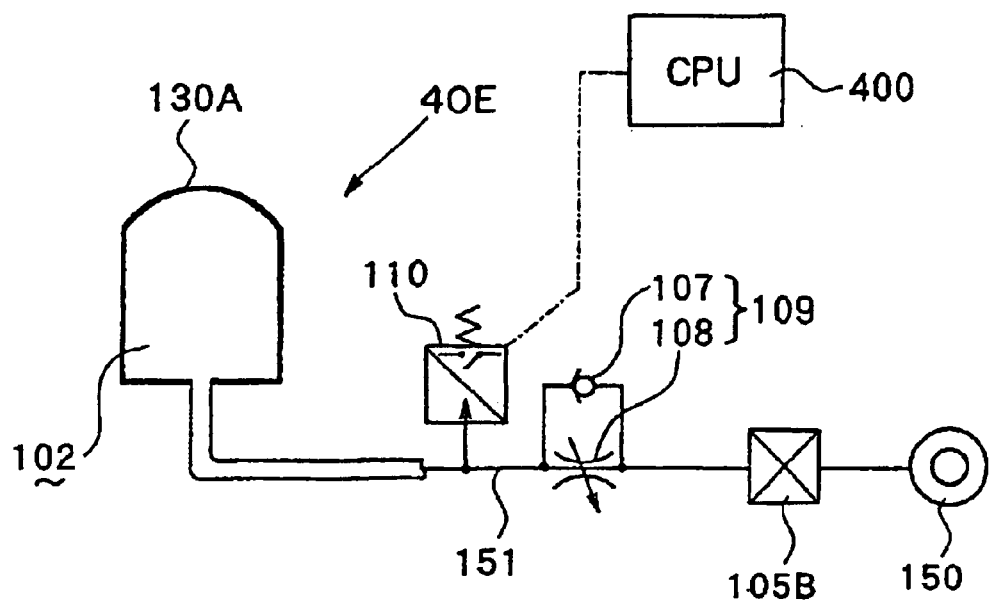
F I G. 11A
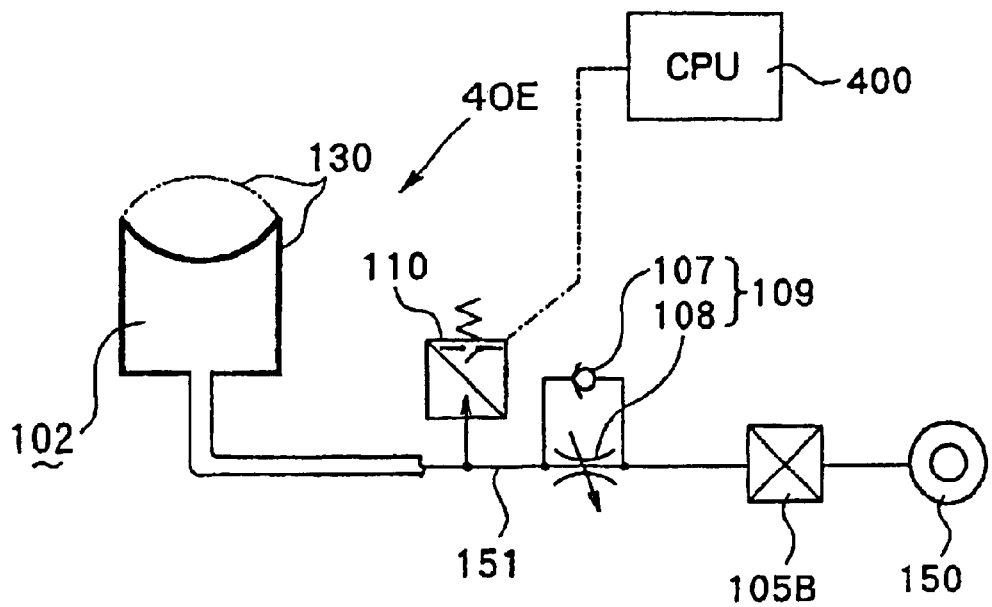
F I G. 11B

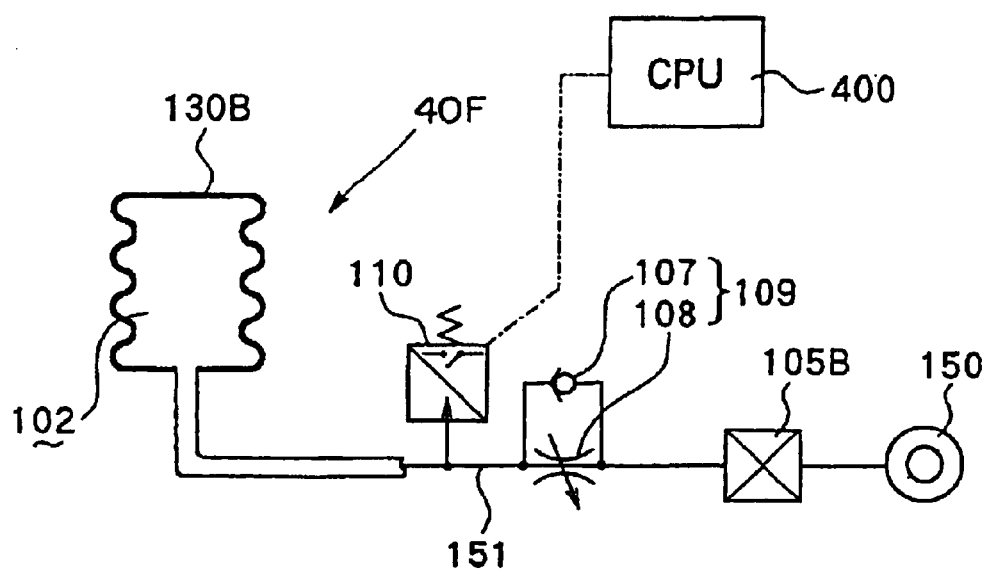
F I G. 12A
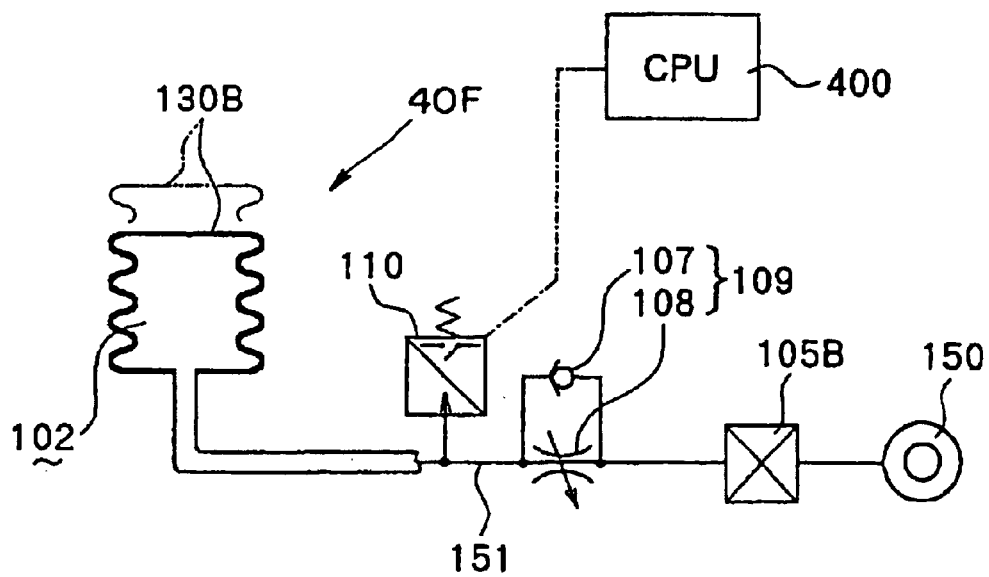
F I G. 12B

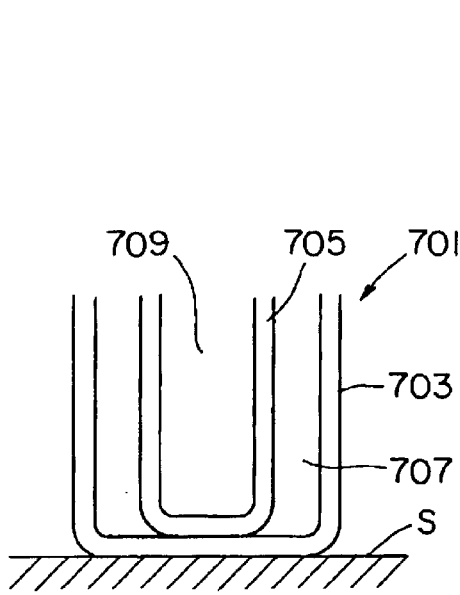
F I G. 20
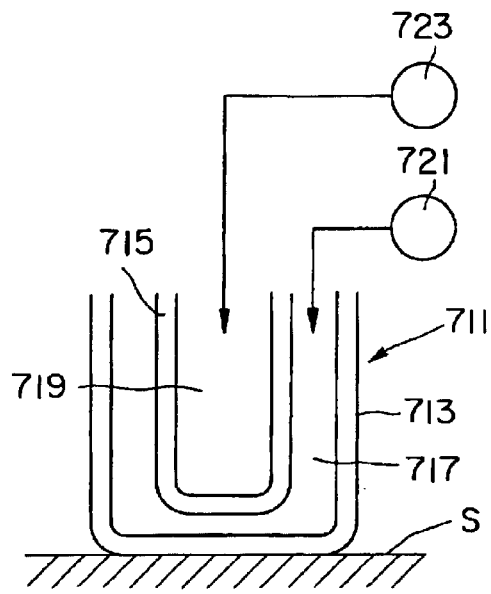
F I G. 21
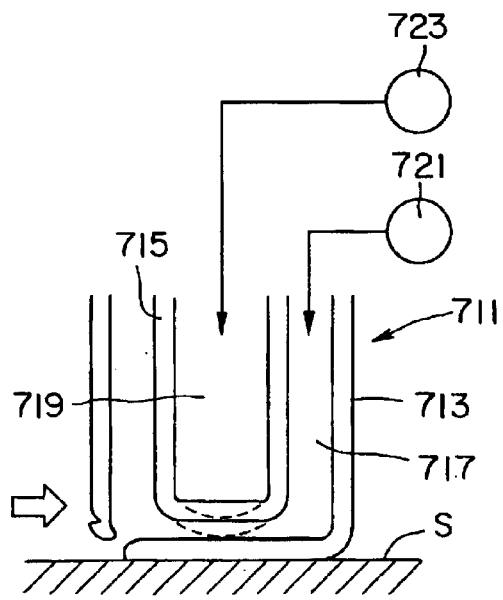
F I G. 22
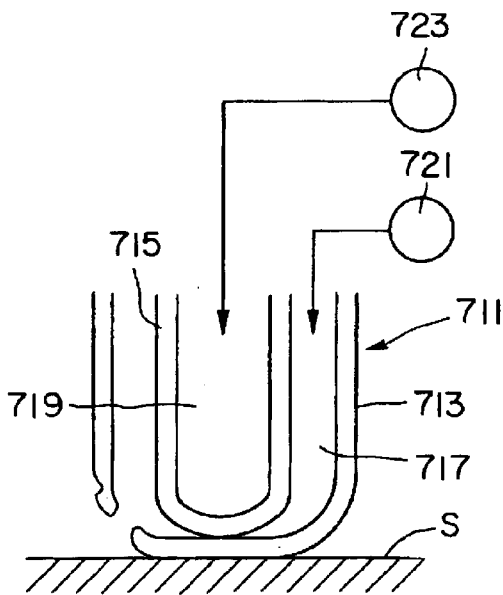
F I G. 23

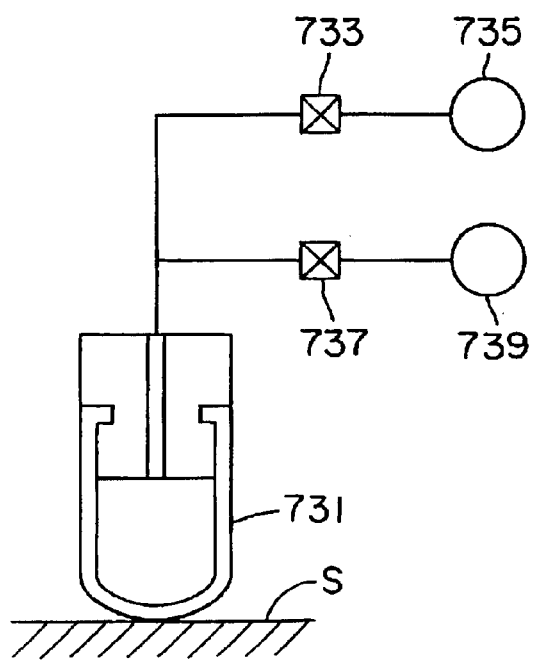
F I G. 24
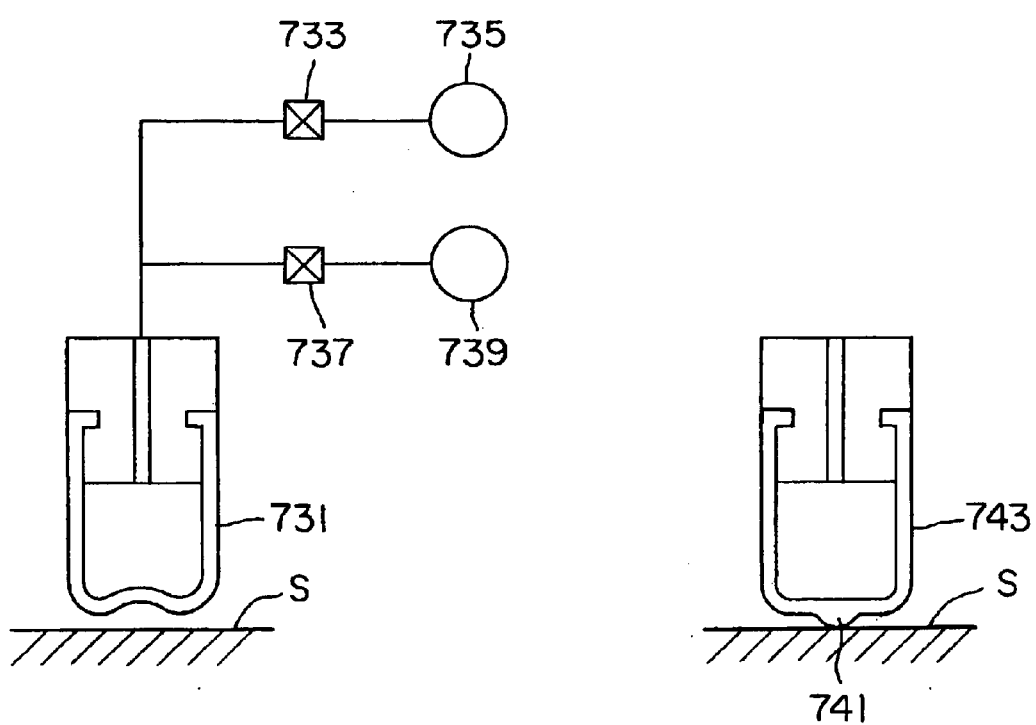
F I G. 25  F I G. 26

PROCESSING APPARATUS WITH SEALING MECHANISM

BACKGROUND OF THE INVENTION

1. Technical Field of the Invention

This invention relates to a processing apparatus with sealing mechanism, more particularly, the processing apparatus with sealing mechanism, which accommodates objects to be processed, such as semiconductor wafers and LCD glass substrates, in a processing chamber having a sealed atmosphere and which makes the objects in contact with processing fluid (e.g. chemical liquid, rinsing liquid), drying fluid, reactive gas or the like.

2. Description of the Related Art

Generally in the manufacturing process of semiconductor devices and the LCD manufacturing process, there is widely adopted, as one processing apparatus with sealing mechanism, a cleaning and drying apparatus that uses the processing fluid, such as processing liquid and gas, in order to remove resist sticking to the object to be processed (e.g. semiconductor wafer, LCD glass) and residue (polymer etc.) sticking thereto after the drying process. Note, the above object to be processed will be referred as wafer, hereinafter. Additionally, in this specification, the processing liquid designates chemical liquid (e.g. organic solvent, organic acid, inorganic acid), rinsing liquid or the like, while the gas designates dry gas, atmosphere-control gas or the like.

As the conventional cleaning and drying apparatus of this kind, for example, there is known a cleaning and drying apparatus that comprises a processing chamber having one side opened to load and unloading the wafers etc., holding means (e.g. rotor) for rotating a carrier arranged in the processing chamber to accommodate the wafers etc., closing means (e.g. lid) for closing the opening of the processing chamber, liquid supply means for supplying the wafers etc. with liquid and gas supply means for supplying the wafers etc. with gas.

When processing the wafers etc. in contact with the processing fluid in the above cleaning and drying apparatus, a gap between the processing chamber and the closing means (i.e. lid) has to be maintained in a leak-tight manner by the sealing mechanism in order to prevent the leakage of the processing fluid to the outside. Hitherto, either the processing chamber or the closing means (lid) has been provided with a sealing member to maintain the gap between the processing chamber and the closing means (lid) in the leak-tight manner.

However, the conventional sealing mechanism has been required to improve its sealing capability due to the sealing member of its single-row structure. That is, if the sealing part is damaged or does not give full sealing effect for some reason or other, then a problem may arise in that the processing fluid or vapor resulting from using high-temperature liquid or gas as the processing liquid leaks outside. With the necessity of sealing a part operating at both times of sealing and non-sealing, it has been also studied to expand the sealing member by using pressurized fluid at the sealing; nevertheless there still exists a problem of the sealing member's short life span and also a necessity of measure against the sealing member's breakage. Further, since the use of high-temperature liquid or gas as the processing fluid causes the sealing member to be exposed to the high-temperature atmosphere, the sealing member has to be made from heat-resistant material, restricting the scope of materials for the sealing member.

In the conventional sealing mechanism of this kind, there is a possibility that the sealing member is deteriorated by the atmosphere of high temperature. If the sealing member is pressurized by compressive fluid, such as air and $N_2$-gas, it is feared that due to the usual application of constant pressure, the sealing member swells for breakage or is unable to give full play to its sealing effect under the processing atmosphere of high temperature. In such a case, a problem may arise in that the processing fluid or the vapor resulting from using high-temperature liquid or gas as the processing fluid leaks out. Again, when using high-temperature liquid or gas as the processing fluid, there may arise a problem that rubber or synthetic resin material forming the sealing member is so hardened or softened improperly that not only does the sealing capability drop, but also the life span of the seaming member is deteriorated.

Under the above situation, the object of the present invention is to provide a processing apparatus with sealing mechanism, which is capable of both improvement of sealing capability and increase of life span.

SUMMARY OF THE INVENTION

The first feature of the present invention resides in the provision of a processing apparatus with sealing mechanism, comprising a processing container having a processing container body with an opening and a closing member for closing the opening, the processing container defining a processing chamber therein, and also making an object to be processed that is positioned in the processing chamber, to contact a processing fluid thereby processing the object, wherein either one of the processing container body and the closing member is provided, at a closing part formed between the processing container body and the closing member, with flexible hollow sealing members in a duplex arrangement; and a source of pressurized fluid is connected to respective hollow parts of the hollow sealing members through a pressure detector and a closing valve.

With the above structure, when supplying the pressurized fluid from the source into the hollow parts of the hollow sealing members in double, they swell for sealing. Simultaneously, the pressurized condition at this time can be monitored by pressure-detecting means. Therefore, even if one of the hollow sealing members is broken so as not to display its sealing effect, such a situation can be detected by the pressure-detecting means. Moreover, since the other hollow sealing member operates to maintain the sealing capability of the apparatus in spite of the broken hollow sealing member, it is possible to plan to prolong the life of the whole sealing section of the apparatus and also possible to improve its sealing capability and security.

The second feature of the present invention resides in that the source of pressurized fluid is adapted so as to supply a gas source.

The third feature of the present invention resides in that the source of pressurized fluid is adapted so as to supply cooling water; and the hollow parts of the hollow sealing members are connected with a drain pipe. Thus, with the flowing of the cooling water as the pressurized fluid into the hollow parts of the hollow sealing members, the life of the sealing members themselves can be prolonged with a restraint on a rise in temperature of the sealing members by the heat treatment at high temperatures.

The fourth feature of the present invention resides in that the drain pipe is provided with a closing valve and a flow regulator in parallel. Thus, since the closing means and the flow-regulating means are juxtaposed in the drain pipe, both sealing state and non-sealing state can be accomplished by the adjustment in displacement of the cooling water. Additionally, the opening of the closing means in case of breakage of the sealing members allows the cooling water to be drained quickly.

The fifth feature of the present invention resides in the provision of a processing apparatus with sealing mechanism, comprising a processing container having a processing container body with an opening and a closing member for closing the opening, the processing container defining a processing chamber therein, and also making an object to be processed that is positioned in the processing chamber, to contact a processing fluid thereby processing the object, wherein either one of the processing container body and the closing member is provided, at a closing part formed between the processing container body and the closing member, with a deformable hollow sealing member which is deformable against the processing container body or the closing member; and the deformable hollow sealing member has a hollow part connected to a closing switching valve and a pressure regulator.

With this structure, it is possible to switch the operation of the sealing mechanism between its sealing state and non-sealing state by the application of small positive or small negative pressure through the pressure-regulating means on the deformable hollow sealing members for their deformation. Thus, since the frictional wear is reduced in comparison with the sealing members swelling by the pressurized fluid, it is possible to plan an increase in the life of the sealing members.

The sixth feature of the present invention resides in that the deformable hollow sealing member is arranged doubly and has a hollow part further connected to a pressure detector. With this structure, it is possible to establish the sealing condition by, for example, the application of positive or negative pressure via the pressure-regulating means on the hollow parts of the hollow sealing members for their deformation. Further, the pressurized or pressure-reduced condition can be monitored by the pressure-detecting means. Therefore, even if one of the hollow sealing members is broken so as not to display its sealing effect, such a situation can be detected by the pressure-detecting means. Moreover, since the other hollow sealing member operates to maintain the sealing capability of the apparatus in spite of the broken hollow sealing member, it is possible to increase the life of the whole sealing section of the apparatus and also possible to improve its sealing capability and security.

The seventh feature of the present invention resides in that the pressurized regulator is identical to a gas source.

The eighth feature of the present invention resides in that the pressurized regulator is identical to a suction device.

The ninth feature of the present invention resides in that an interval between the hollow sealing members in the duplex arrangement is connected with an exhaust device through a leakage detector. With this structure, it is possible to monitor the sealing situation of the hollow sealing members. Additionally, by increasing the displacement, the processing chamber and the closing means can be drawn together into close contact, allowing the sealing capability to be improved furthermore.

The $10^{th}$. feature of the present invention resides in the provision of a processing apparatus with sealing mechanism, comprising a processing container having a processing container body with an opening and a closing member for closing the opening, the processing container defining a processing chamber therein, and also making an object to be processed that is positioned in the processing chamber, to contact a processing fluid thereby processing the object, wherein either one of the processing container body and the closing member is provided, at a closing part formed between the processing container body and the closing member, with a flexible hollow sealing member; and a source of pressurized fluid is connected to a hollow part of the hollow sealing member through a fluid pipeline interposing a heat regulator for pressurized fluid.

The $11^{th}$. feature of the present invention resides in the provision of a processing apparatus with sealing mechanism, comprising a processing container having a processing container body with an opening capable of discharging a processing fluid and a closing member for closing the opening, the processing container defining a processing chamber therein, and also making an object to be processed that is positioned in the processing chamber to contact the processing fluid thereby processing the object, wherein either one of the processing container body and the closing member is provided, at a closing part formed between the processing container body and the closing member, with a flexible hollow sealing member; and a source of pressurized fluid is connected to a hollow part of the hollow sealing member through a fluid pipeline interposing a heat regulator for pressurized fluid.

The $12^{th}$. feature of the present invention resides in the provision of a processing apparatus with sealing mechanism, comprising a processing container having a processing container body with an opening capable of loading and unloading an object to be processed and a closing member for closing the opening, the processing container defining a processing chamber therein, and also making the object that is positioned in the processing chamber to contact a processing fluid thereby processing the object, wherein either one of the processing container body and the closing member is provided, at a closing part formed between the processing container body and the closing member, with a flexible hollow sealing member; and a source of pressurized fluid is connected to a hollow part of the hollow sealing member through a fluid pipeline interposing a heat regulator for pressurized fluid.

The $13^{th}$. feature of the present invention resides in the provision of a processing apparatus with sealing mechanism, comprising a processing container having an opening, a holder for holding an object to be processed in a processing chamber defined in the processing container, and a rod provided, at an end thereof, with the holder and also slidably inserted into the opening, and also making the object held by the holder to contact a processing fluid thereby processing the object, wherein a flexible hollow sealing member is arranged on the processing container sliding with respect to the rod; and a source of pressurized fluid is connected to a hollow part of the hollow sealing member through a fluid pipeline interposing a heat regulator for pressurized fluid.

According to the $10^{th}$., $11^{th}$., $12^{th}$. and $13^{th}$. features of the invention, when supplying the pressurized fluid, for example, air, inert gas, etc. from the source of pressurized fluid into the hollow part of the hollow sealing member, it swells for sealing. Simultaneously, the temperature of pressurized fluid can be controlled by the heat regulating means. Thus, with the possibility of adjusting the temperature of the pressurized fluid in accordance with the temperature of the processing fluid, it is possible to bring the hollow sealing member into a suitable condition for expansion and contraction, whereby the life of the sealing member can be increased with an improvement in sealing capability of the mechanism.

The 14th. feature of the present invention resides in that a pressure detector and a closing valve are interposed in the fluid pipeline. Therefore, even if the hollow sealing member is broken so as not to display its sealing effect, such a situation can be detected by the pressure-detecting means, improving the security of the apparatus.

The 15th. feature of the present invention resides in that the source of pressurized fluid is adapted so as to supply a gas source.

The 16th. feature of the present invention resides in that the source of pressurized fluid is formed by a liquid supply source, while drain pipe is connected with the hollow part of the hollow sealing member. In this way, with the flowing of liquid (incompressible fluid) as the pressurized fluid into the hollow part of the hollow sealing member, it is possible to make both expansion and contraction of the sealing member properly without being influenced by thermal circumference, allowing the life of the sealing member itself to be increased.

The 17th. feature of the present invention resides in that the drain pipe has a closing valve and a flow regulator interposed in parallel. With this arrangement, it is possible to accomplish both sealing state and non-sealing state by adjusting the displacement of the liquid and also possible to supply the liquid of controlled temperature at both sealing state and non-sealing state. Additionally, the opening of the closing means in case of breakage of the sealing member allows the liquid to be drained quickly.

The 18th. feature of the present invention resides in the provision of a processing apparatus with sealing mechanism, comprising a processing container having a processing container body with an opening and a closing member for closing the opening, the processing container defining a processing chamber therein, and also making an object to be processed that is positioned in the processing chamber, to contact a processing fluid thereby processing the object, wherein either one of the processing container body and the closing member is provided, at a closing part formed between the processing container body and the closing member, with a flexible hollow sealing member; and the hollow sealing member includes an outer sealing member having flexibility with a hollow part and an inner sealing member arranged in the hollow part of the outer sealing member to also have flexibility with a hollow part; and the hollow part of the outer sealing member and the hollow part of the inner sealing member are connected with a source of pressurized fluid through a fluid pipeline.

The 19th. feature of the present invention resides in that at least the hollow part of the outer sealing member is supplied with cooled pressurized fluid.

The 20th. feature of the present invention resides in that the hollow part of the inner sealing member and the hollow part of the outer sealing member are supplied with pressurized fluids of the same pressure.

BRIEF DESCRIPTION OF THE DRAWINGS

FIG. 8 is an enlarged sectional view of the essential part of the sealing mechanism in accordance with the third embodiment of the invention;

FIG. 11A is a sectional view of the essential part of the sealing mechanism in accordance with the other embodiment of the invention, showing its sealing state;

FIG. 11B is a sectional view of the essential part of the sealing mechanism in accordance with the embodiment of FIG. 11A, showing its non-sealing state;

FIG. 12A is a sectional view of the essential part of the sealing mechanism in accordance with the further embodiment of the invention, showing its sealing state;

FIG. 12B is a sectional view of the essential part of the sealing mechanism in accordance with the embodiment of FIG. 12A, showing its non-sealing state;

FIG. 20 is a sectional view showing one example of a double hollow packing concerned in the present invention;

FIG. 21 is a sectional view showing another example of the double hollow packing concerned in the present invention;

FIG. 22 is a sectional view showing a condition that an outer packing is torn in the double hollow packing of FIG. 21;

FIG. 23 is a sectional view showing a condition that the double hollow packing of FIG. 21 recovers its sealing capability after the outer packing has been torn;

FIG. 24 is a view showing an example of the hollow packing having compressing means and vacuum-forming means, showing a condition that the hollow packing is compressed;

FIG. 25 is a view of the hollow packing of FIG. 24, showing a condition that it is evacuated for vacuum;

FIG. 26 is a sectional view showing one example of the hollow packing provided, at a tip thereof, with a projected ridge;

DESCRIPTION OF THE PREFERRED EMBODIMENT

With reference to attached drawings, embodiments of the present invention will be described below. In these embodiments, the sealing mechanism related to the present invention is applied to a cleaning and drying apparatus for semiconductor wafers.

Figure 1:
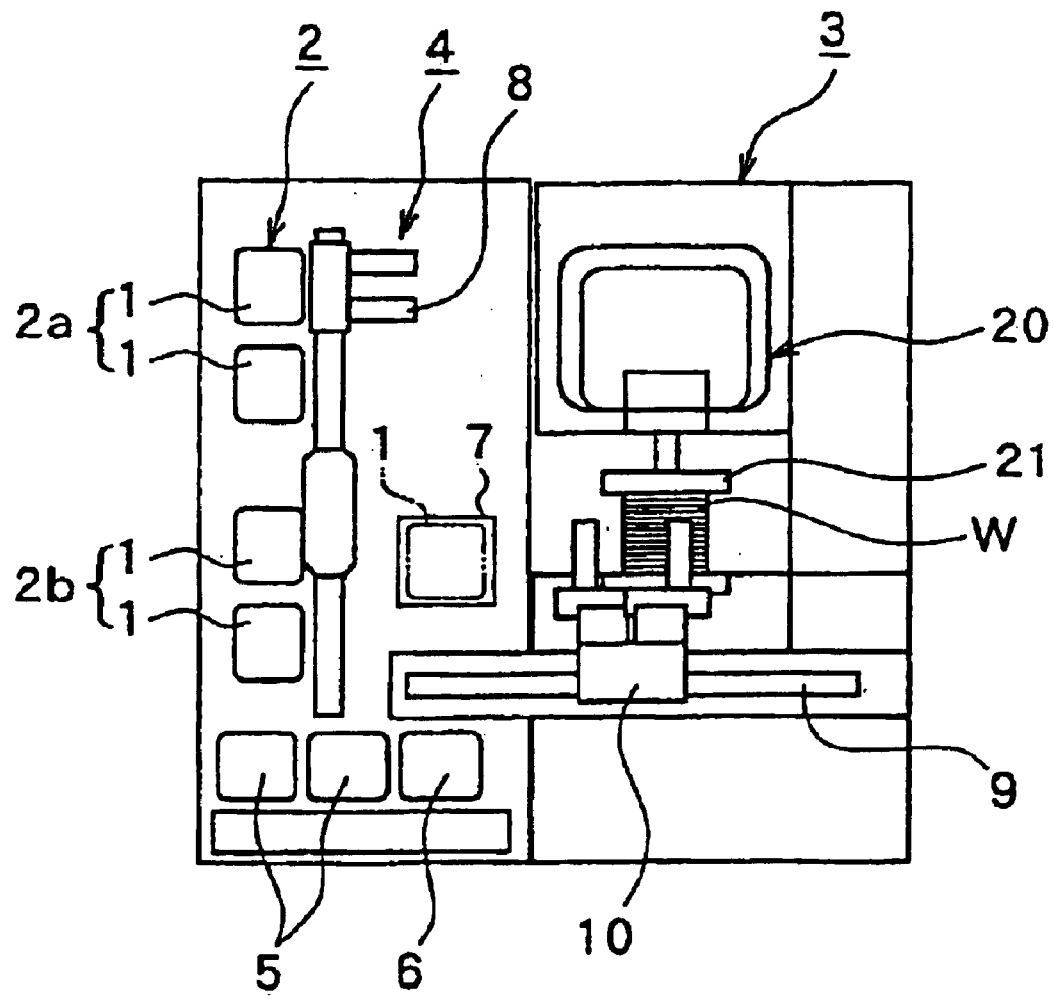
FIG. 1 is a schematic plan view of a cleaning and drying apparatus where the processing apparatus in accordance with the present invention is applied.

FIG. 1 is a schematic plan view showing an example of a cleaning and drying system on application of the sealing mechanism of the invention.

The cleaning and drying system is mainly formed by a loading/unloading part 2 to load and unload a container for accommodating plural, for example, twenty-five pieces of semiconductor wafers W (referred "wafers W", hereinafter), a processing part 3 for processing the wafers W with liquid and drying them sequentially and an interface part 4 between the loading/unloading part 2 and the processing part 3 to deliver the wafers W and also perform their positional adjustment and posture change. On the lateral side of the loading/unloading part 2 and the interface part 4, there are arranged carrier stocks 5 for accommodating the vacant carriers 1 temporarily and a carrier cleaner 6 for cleaning the carriers 1.

The above loading/unloading part 2 is arranged on one lateral side of the cleaning and drying apparatus, juxtaposing a carrier loading part 2a and a carrier unloading part 2b.

A carrier mount 7 is arranged in the above interface part 4. Between the carrier mount 7 and the loading/unloading part 2, carrier transfer means 8 is arranged to transfer the carrier 1 from carrier loading part 2a to either the carrier mount 7 or the carrier stock 5 and also transfer the carrier 1 on the carrier mount 7 to either the carrier unloading part 2b or the carrier stock 5. Further, the interface part 4 is provided with a transfer path 9 stretching the processing part 3. Wafer transfer means, for example, a wafer transfer chuck 10 is movably arranged on the transfer path 9. The wafer transfer chuck 10 has a structure allowing the unprocessed wafers W in the carrier 1 on the carrier mount 7 to be transferred to the processing part 3 and also allowing the processed wafers W processed at the processing part 3 to be loaded into the carrier 1.

Meanwhile, the processing part 3 is provided with a processing apparatus 20 for removal of resist, polymer, etc. sticking to the wafers W.

Figure 2:
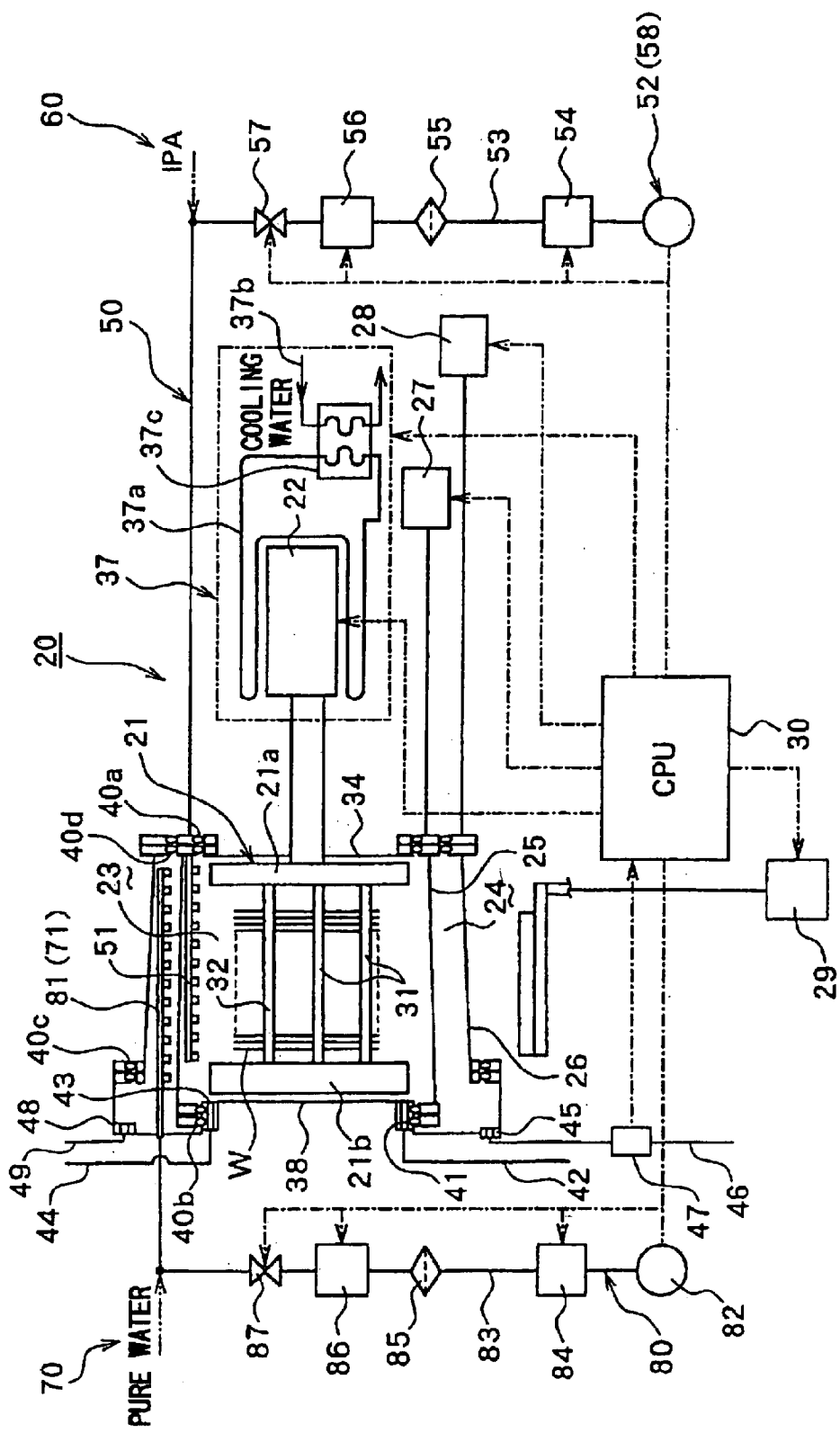
FIG. 2 is a schematic structural view of the processing apparatus in accordance with the present invention.

As shown in FIG. 2, the above processing apparatus 20 includes, as main constituents, rotatable holding means for holding the wafers W, for example, a rotor 21, a motor 22 (drive means) for rotating the rotor 21 about a horizontal axis and inner and outer chambers 23, 24 for defining plural, e.g. two processing chambers (first and second processing chambers) to surround the wafers W held by the rotor 21. The processing apparatus 20 further includes supply means 50 for supplying the wafers W accommodated in the inner chamber 23 or the outer chamber 24 with processing fluid, for example, chemical liquids (e.g. resist stripper, polymer remover, etc.), supply means 60 for supplying a solvent for the chemical liquid, for example, isopropyl alcohol (IPA), supply means (rinsing liquid supply means) 70 for supplying a rinsing liquid, for example, pure water etc. or supply means 80 for supplying a drying gas, for example, inert gas such as nitrogen gas ($N_2$), fresh air, etc. (both means 50 and 80 are shown in FIG. 2), moving means, for example, first and second cylinders 27, 28 for moving an inner cylinder 25 forming the inner chamber 23 and an outer cylinder 26 forming the outer chamber 24 between a position to surround the wafers W and a standby position apart from the surrounding position and object delivery means, for example, a wafer delivery hand 29 for delivering the wafers W from the wafer delivery chuck 10 to the rotor 21, and vice versa.

The motor 22 of the above-constructed processing apparatus 20, respective supply parts of the supply means 50, 60, 70, 80 for the processing fluids (FIG. 2 shows the chemical supply means 50 and the dry fluid supply means 80), the wafer delivery hand 29, etc. are all controlled by control means, for example, a central processing unit (CPU) 30.

Figure 3A:
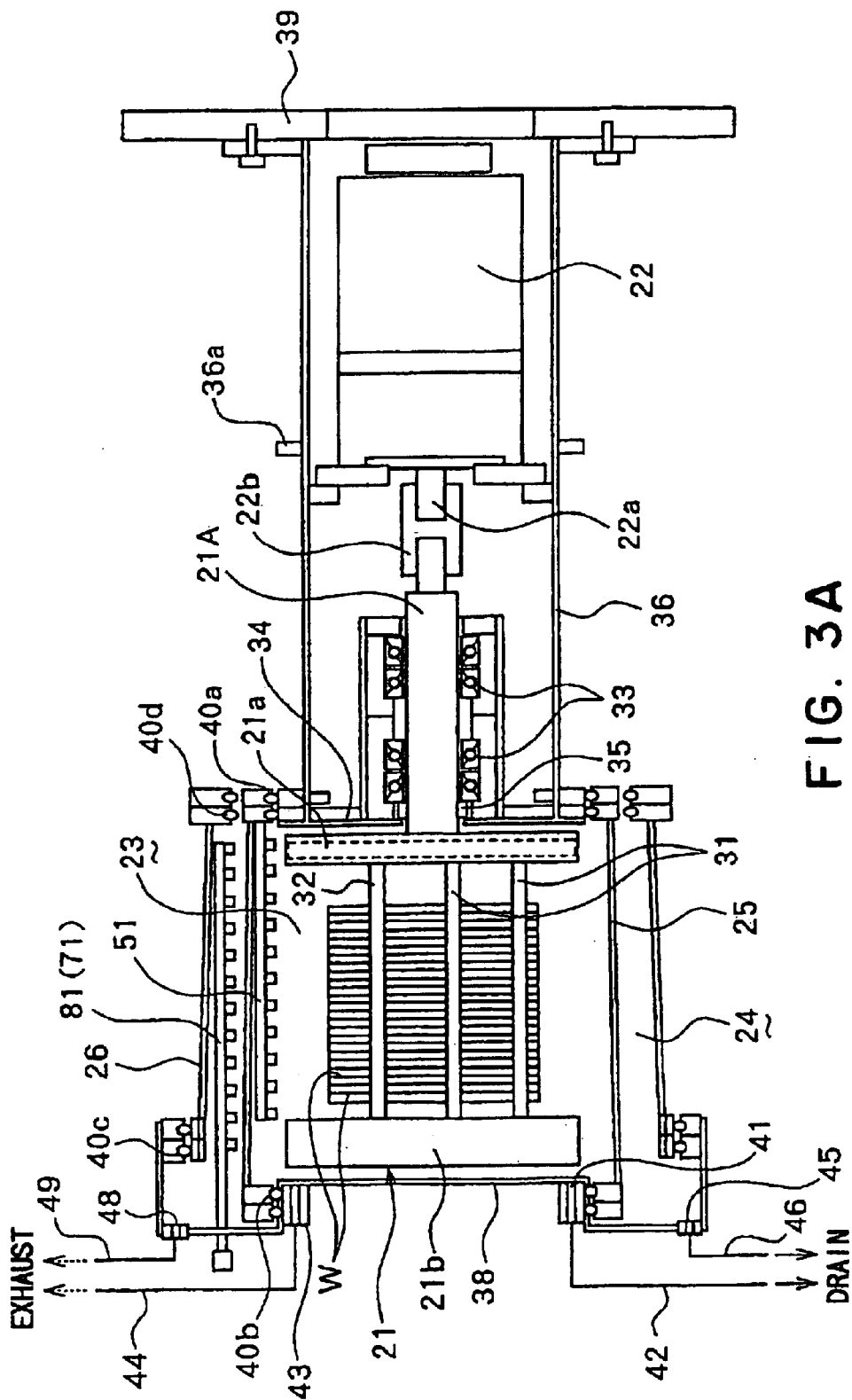
FIG. 3A is a sectional view of an essential part of the processing apparatus of the present invention, showing a condition that an inner cylinder is laid to overlap inside an outer cylinder.

As shown in FIG. 3A, the rotor 21 is connected with a horizontal drive shaft 22a of the motor 22 in a cantilever manner. The rotor 21 carries the wafers W so as to direct their processing surfaces vertically and is adapted so as to be rotatable about the horizontal axis. The rotor 21 comprises a first rotary disc 21a having a rotating shaft 21A connected with the drive shaft 22a of the motor 22 through a coupling 22b, a second rotary disc 21b opposing the first rotary disc 21a, plural, for example four immovable carrying rods 31 built between the first rotary disc 21a and the second rotary disc 21b, and a pair of pusher rods 32 for pushing down the upper parts of the wafers W retained by retaining grooves (not shown) formed on the rods 31 in succession. The pusher rods 32 are switched to move to their pushing positions and non-pushing positions by means of not-shown locking means and unlocking means. The rotating shaft 21A of the rotor 21 is rotatably supported by a first stationary wall 34 through bearings 33. Further, owing to the provision of a labyrinth seal 35 adjoining the bearing 33 on the side of the first stationary wall, the rotor 21 is constructed in a manner that particles etc. from the motor 22 do not enter into the processing chamber (see FIG. 3A). Note, the motor 22 is accommodated in a stationary cylinder 36 succeeding the first stationary wall 34. In accordance with a program stored in the CPU 30 in advance, the motor 22 is controlled so as to be rotatable at predetermined revolutions selectively.

As there is a possibility that the motor 22 is overheated, it is provided with cooling means 37 for restricting the overheating. As shown in FIG. 2, the cooling means 37 is formed by a circulation-type cooling pipe 37a arranged around the motor 22 and a heat exchanger 37c having the cooling pipe 37a and a cooling-water supply pipe 37b partially arranged for cooling a coolant liquid sealed in the cooling pipe 37a. In this case, the cooling means 37 employs, as the coolant liquid, an electrically-insulating liquid that would not cause a leakage of electricity in the motor 22 if the liquid is leaked out, also exhibiting appropriate heat conductivity, for example, ethylene glycol. Additionally, the cooling means 37 is controlled by the CPU 30 so as to be operable in accordance with signals detected by a not-shown temperature sensor. Note, the cooling means 37 is not always provided with the above-mentioned structure and may be selected optionally, for example, air-cooled one, electrically-operated one having Peltier elements or the like.

Figure 3B:
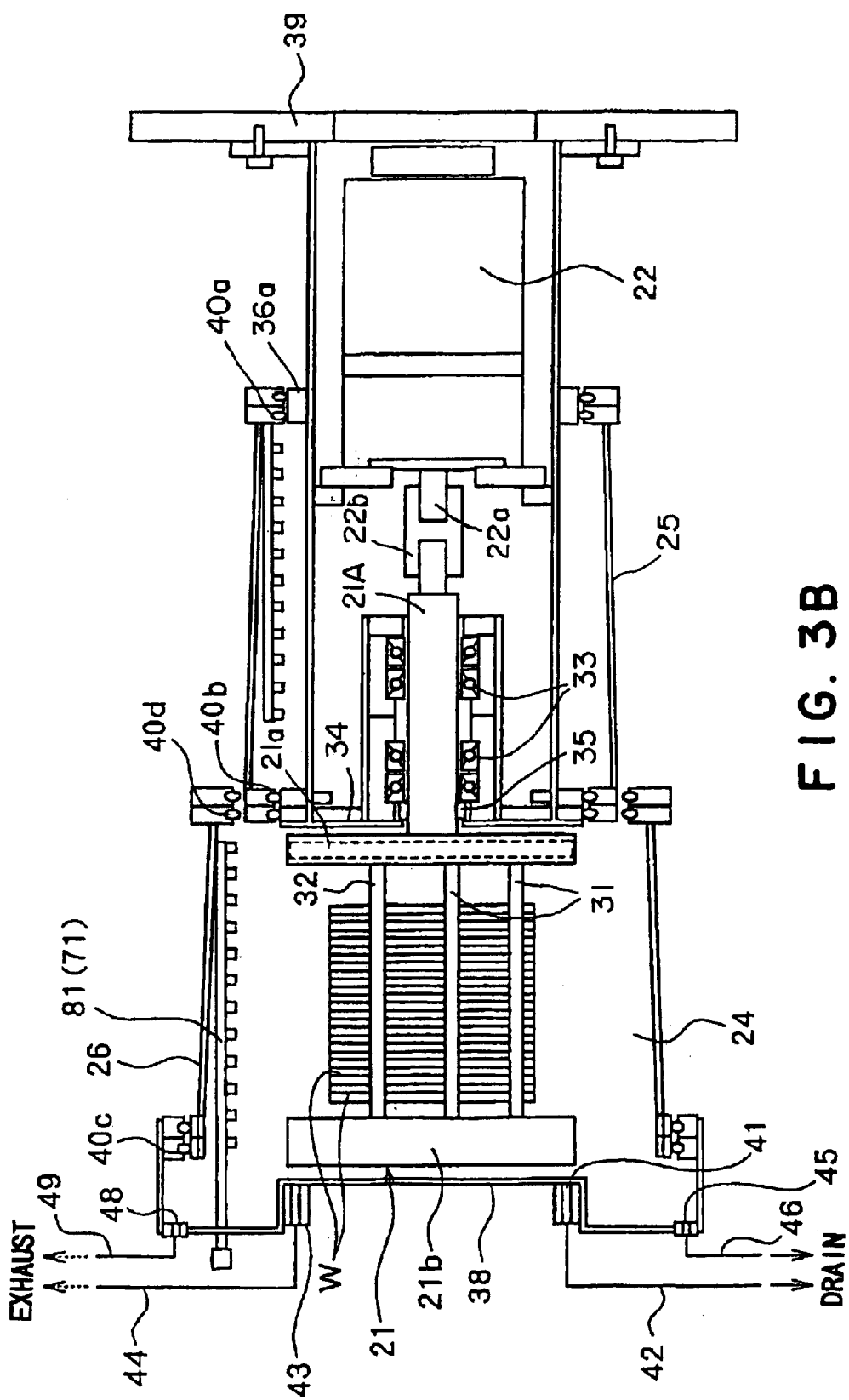
FIG. 3B is a sectional view of the essential part of the processing apparatus of the present invention, showing a condition that an inner cylinder is withdrawn from the outer cylinder.

Meanwhile, the processing chamber, for example, the inner chamber (first processing chamber) 23 is defined by the following elements: a first stationary wall 34 (closing means); a second stationary wall 38 opposing the first stationary wall 34; and the inner cylinder 25 between the first stationary wall 34 and the second stationary walls 38, the inner cylinder 25 being engaged with the walls 34, 48 through a first sealing member 40a and a second sealing member 40b, respectively. The first and second sealing members 40a, 40b constitute seal mechanisms 40, 40A to 40K mentioned later. By expansion of the first cylinder 27 (moving means), the inner cylinder 25 is moved to a position to surround the rotor 21 and the wafers W to form the inner chamber (the first processing chamber) 23. Then, the inner cylinder 25 is sealed against the first stationary wall 34 through the first sealing member 40a and also against the second stationary wall 38 through the second sealing member 40b (see FIGS. 2 and 3A). While, by shrinkage of the first cylinder 27, the inner cylinder 25 is also moved to a position (standby position) outside a fixed cylinder 36. Then, as shown in FIG. 3B, the front opening of the inner cylinder 25 is sealed against the first stationary wall 34 through the second sealing member 40b, while the base end of the inner cylinder 25 is sealed against a flange part 36a surrounding the intermediate portion of the fixed cylinder 36, through the first sealing member 40a. In this way, it is possible to prevent the atmosphere of the chemical liquid remaining in the inner chamber 23 from leaking out.

On the other hand, as shown in FIG. 3B, the outer chamber (the second processing chamber) 24 is defined by the following elements: the first stationary wall 34 interposing the second sealing member 40b against the inner cylinder 25 moved to the standby position; the second stationary wall 38; and the outer cylinder 26 between the second stationary wall 38 and the inner cylinder 25, the outer cylinder 26 being engaged with the wall 38 and the inner cylinder 25 through a third sealing member 40c and a fourth sealing member 40d, respectively. By expansion of the second cylinder 28 (moving means), the outer cylinder 26 is moved to a position to surround the rotor 21 and the wafers W to form the outer chamber (second processing chamber) 24. Then, the outer cylinder 26 is sealed against the second stationary wall 38 through the third sealing member 40c and also sealed through the fourth sealing member 40d positioned outside the base end of the outer cylinder 26. While, by shrinkage of the second cylinder 28, the outer cylinder 26 is also moved to a position (standby position) outside the fixed cylinder 36. In this case, the fourth sealing member 40d is interposed between the base ends of the outer cylinder 26 and the inner cylinder 25, for sealing them. Therefore, since the atmosphere inside the inner chamber 23 and the atmosphere inside the outer chamber 24 are insulated from each other in a leak-tight manner, it is possible to prevent the cross-contamination resulting from the reaction of different processing fluids, without mixing the atmospheres in both of the chambers 23, 24.

The above-constructed inner cylinder 25 and outer cylinder 26 are together tapered so as to extend outward toward their ends. These cylinders 25, 26 are attached so as to be slidable along three parallel guide rails (not shown) extending among the first stationary wall 34, the second stationary wall 38 and an apparatus sidewall 39 all confronting each other on the same horizontal line. By expansion and contraction of the first and second cylinders 27 and 28, the inner cylinder 25 and the outer cylinder 26 are adapted so as to be capable of mutually making frequent appearances and also overlapping with each other, coaxially. Owing to the tapered formation where the inner and outer cylinders 25, 26 extend outward toward their ends, the air stream generated by the rotation of the rotor 21 in the inner cylinder 25 or the outer cylinder 26 at the processing, flows toward the expanded side of the cylinder in a spiral manner, allowing the chemical liquids etc. to be discharged for the expanded side with ease. Additionally, owing to the adoption of structure where the inner cylinder 25 and the outer cylinder 26 overlap with each other on the same horizontal line, it is possible to reduce the installation space for the inner cylinder 25, the outer cylinder 26, the inner chamber 23 and the outer chamber 24 and also possible to provide a compact apparatus.

Note, the inner and outer cylinders 25, 26 are made of stainless steel. Additionally, the inner cylinder 25 is covered, on its outer face, with a heat-insulating layer of e.g. polytetrafluoroethylene (trademark: Teflon). Owing to the provision of the heat-insulating layer, it becomes possible to prevent the chemical liquid supplied for the processing in the inner chamber 23 and also the vapor from being cooled down.

Meanwhile, the first to fourth sealing members 40a–40d forming the seal mechanism 40 are formed by hollow packings inflatable or deformable to one sides of the objects to be sealed, that is, the inner cylinder 25, the outer cylinder 26, the first stationary wall 34 and the second stationary wall 35. The hollow packings are made of synthetic rubber abounding in heat-resistance, chemical-resistance and climate-proof, such as ethylene-propylene-diene mucilage (EPDM) and Callets (product name). By enclosing the packings with compressed air, they expand or deform to seal up the objects (the inner cylinder 25, the outer cylinder 26, the first stationary wall 34 and the second stationary wall 35). While, by stopping the supply of compressed air and also exhausting it, the sealing condition is canceled to allow the inner cylinder 25 or the outer cylinder 26 to be moved. Further, by enclosing the packings with pressurized fluid (compressed fluid or non-compressed fluid), they expand to seal up the objects (the inner cylinder 25, the outer cylinder 26, the first stationary wall 34 and the second stationary wall 35). While, by stopping the supply of pressurized fluid and also exhausting it, the sealing condition is canceled to allow the inner cylinder 25 or the outer cylinder 26 to be moved.

Figure 5:
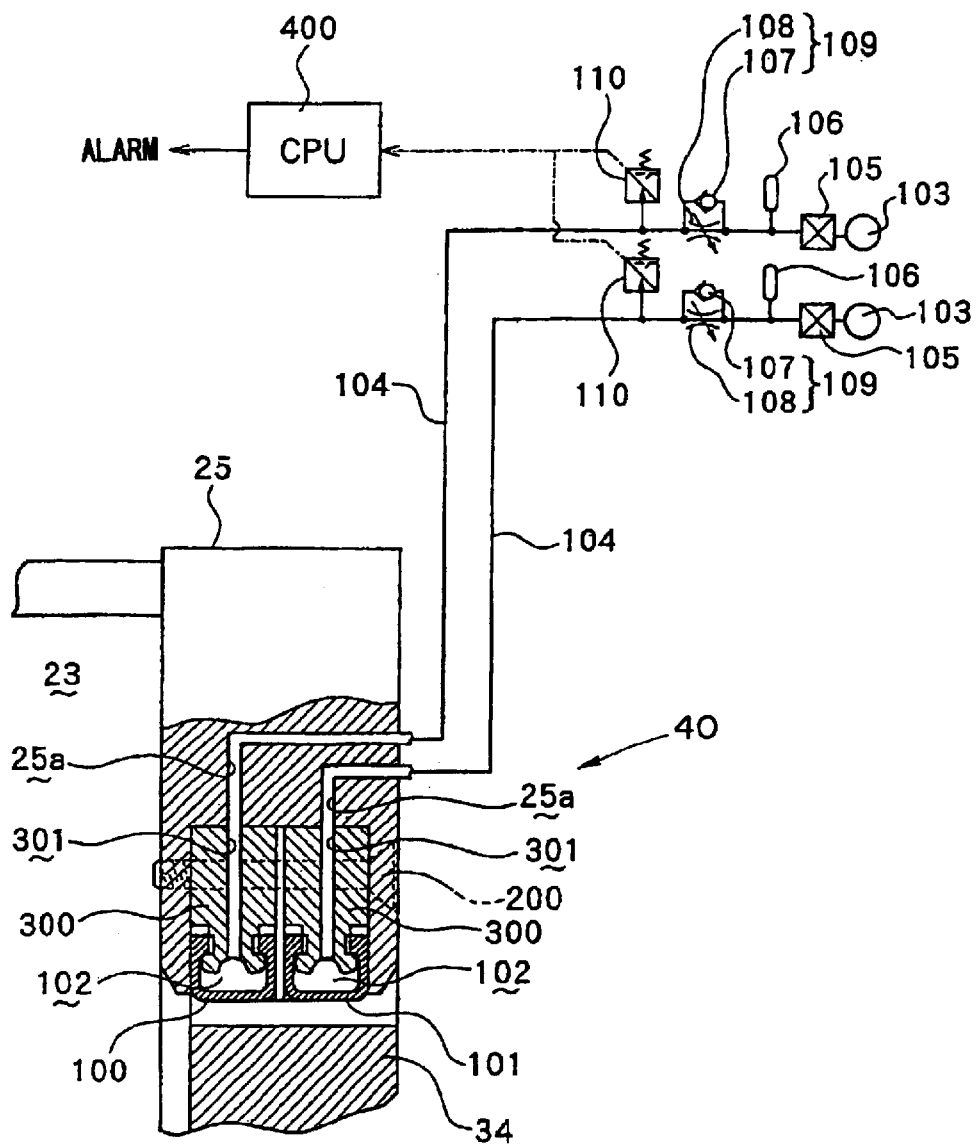
FIG. 5 is an enlarged sectional view of an essential part of a sealing mechanism in accordance with the first embodiment of the invention, showing its non-sealing state.
Figure 6:
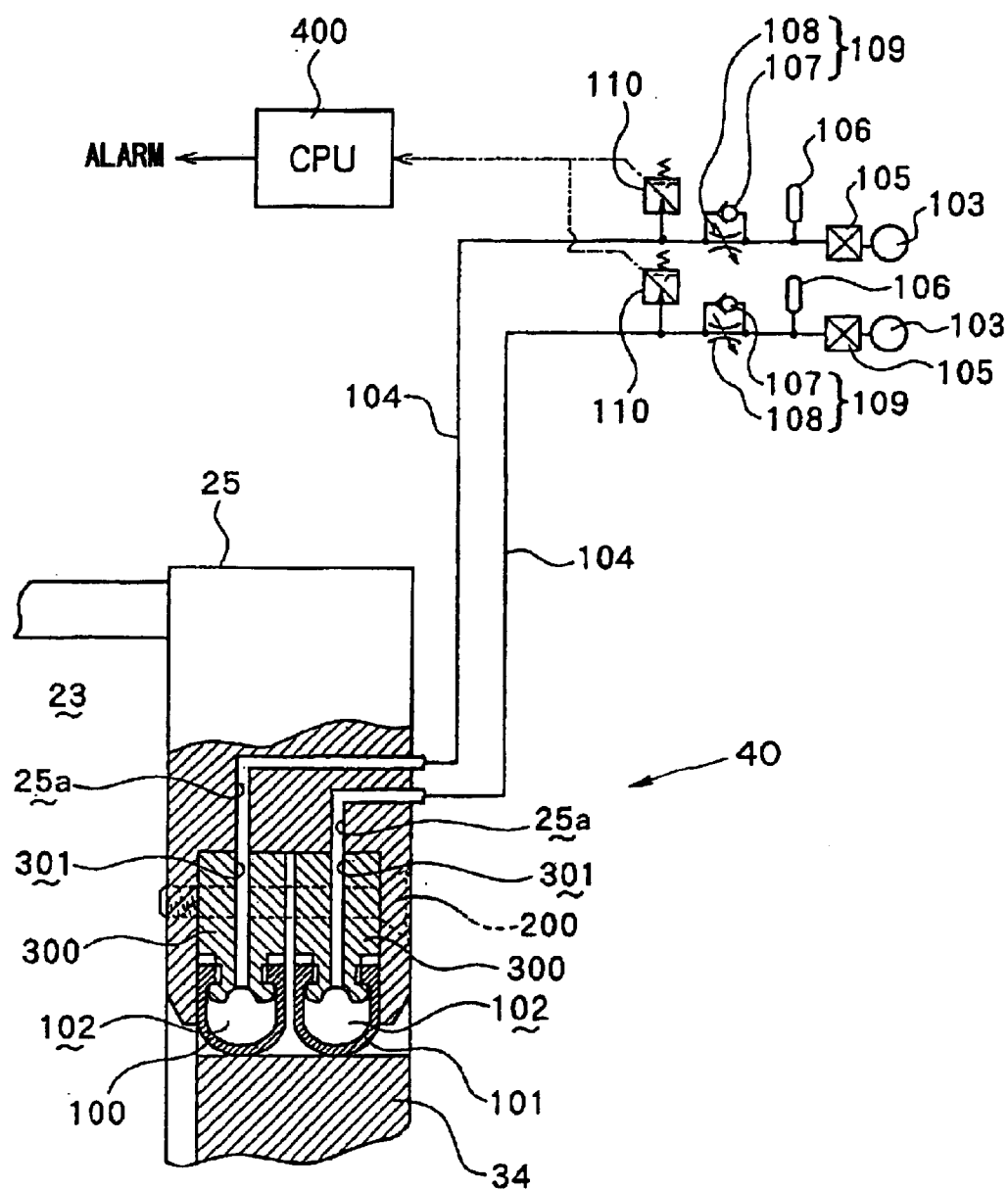
FIG. 6 is an enlarged sectional view of the essential part of the sealing mechanism of FIG. 5, showing its sealing state.

With reference to FIGS. 5 to 12A and 12B, the sealing mechanism will be described in detail, as follows. FIG. 5 is a schematic sectional view of the sealing mechanism 40 in accordance with the first embodiment of the invention, showing its pre-sealing condition. FIG. 6 is a schematic sectional view of the first embodiment, showing the sealing condition.

The sealing mechanism 40 includes the hollow sealing members 40a–40d. This mechanism will be described in representative of the hollow sealing member 40a, hereinafter. This hollow sealing member has hollow sealing members 100, 101 (referred "hollow packings 100, 101" after) doubly-arranged on the inner face of the end of the inner cylinder 25 through two attachment blocks 300. The attachment blocks 300 are fitted to the inner cylinder 25 by attachment screws 200. Each of the hollow packings 100, 101 has its hollow part 102 connected with a pressurized-fluid source, such as air source 103, through an air supply tube 104. In this case, both of the hollow packings 100, 101 are made of the same material; nevertheless the inner and outer hollow packings 100, 101 may be made of different materials, for example, Callets (product name), EPDM, etc. on consideration of heat-resistance and chemical-resistance.

Note, each air supply tube 104 is connected with the attachment block 300 through a passage 301 formed therein and also a communication passage 25a. The communication passage 25a is formed in the inner cylinder 25 so as to communicate with the passage 301. Interposed in each air supply tube 104 are the following elements: a closing valve 105 (closing means); an accumulator 106; a flow-regulating valve 109 consisting of a check valve 107 and a variable choke 108; and a pressure-detecting switch 110 (pressure detecting means), in order from the air source 103 toward the hollow packing 100 (101). Note, the pressure-detecting switches 110 are together connected with control means, for example, a central processing unit 400 (referred "CPU 400" hereinafter) electrically. The detection signals detected by the pressure-detecting switches 110 are transmitted to the CPU 400 to generate a signal (e.g. alarm) therefrom.

According to the sealing mechanism 40 constructed above, under the non-sealing condition shown in FIG. 5, the closing valves 105 are closed to stop the air supply from the air sources 103, so that the hollow packings 100, 101 in their shrunk condition are withdrawn from the first stationary wall 34. Accordingly, the inner cylinder 25 is capable of moving to both of the processing position and the standby position with no contact of the hollow packings 100, 101. While, under the sealing condition of FIG. 6, the closing valves 105 are together opened to supply the hollow parts 102 of the hollow packings 100, 101 with air from the air sources 103 while being gradually pressurized by the synergistic effect of air accumulated in the accumulators 106. By the pressurized air, the hollow packings 100, 101 are inflated to come into close contact with the first stationary wall 34, so that the leak-tight condition can be maintained between the inner cylinder 25 and the first stationary wall 34. In such a sealing condition, even if either one of the hollow packings 100, 101 is broken, the other packing 100 or 101 operates to maintain the sealing condition. Therefore, there is no possibility that the atmosphere in the first processing chamber (the inner chamber 23) leaks out. Then, since the pressure in the hollowing part 102 of the hollow packing 100 or 101 is lowered, the associated pressure-detecting switch 110 detects the pressure-reduced state to transmit a detection signal to the CPU 400, whereby the control signal (alarm etc.) from the CPU 400 allows the breakage etc. of the hollow packing 100 or 101 to be detected. Consequently, it is possible to exchange or repair the broken packing 100 or 101, for example, in advance of the next-coming processing.

Figure 7:
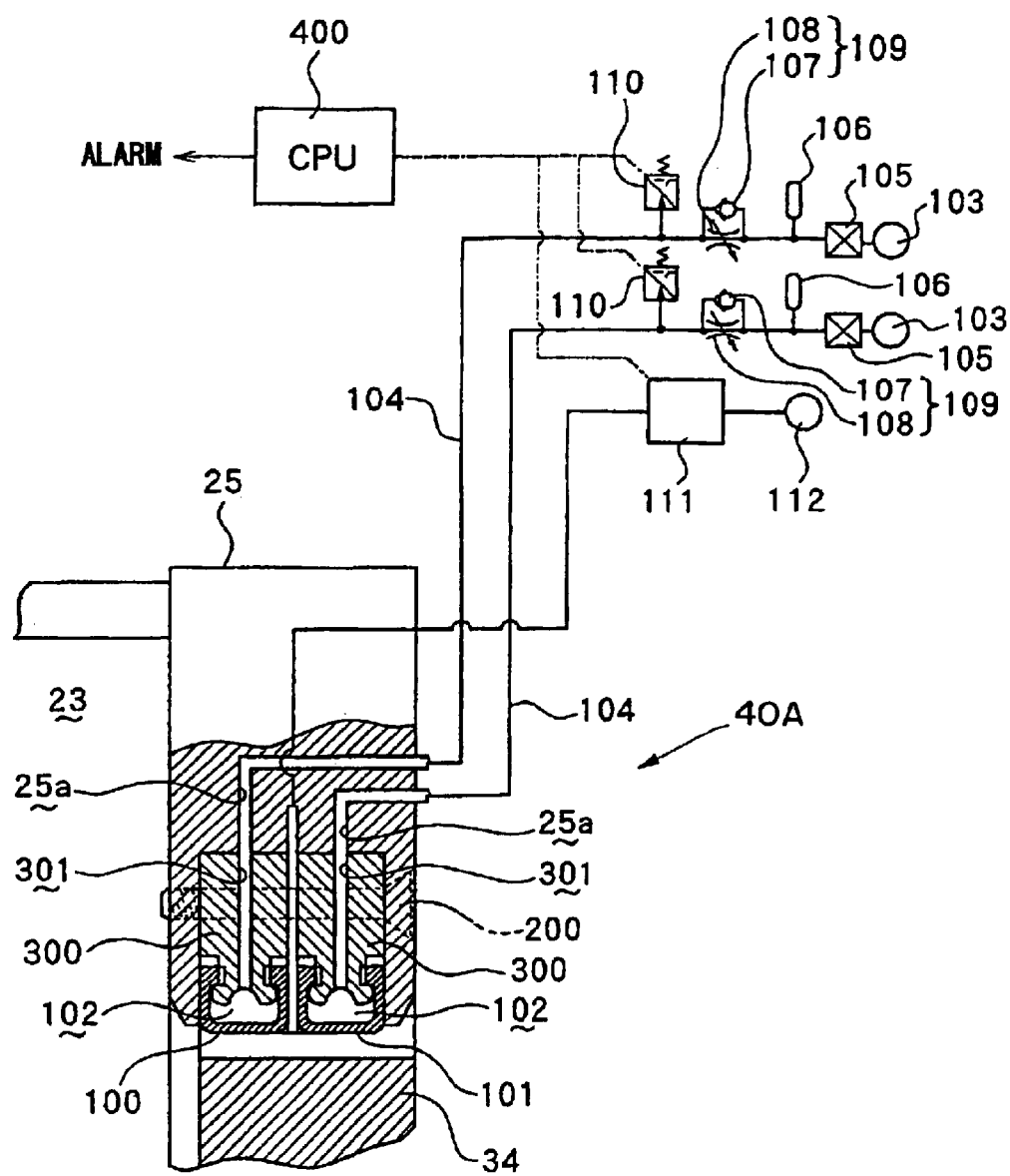
FIG. 7 is an enlarged sectional view of the essential part of the sealing mechanism in accordance with the second embodiment of the invention.

FIG. 7 is a schematic sectional view showing the sealing mechanism of the second embodiment of the invention. The sealing mechanism 40A of the second embodiment is provided for purposes of improvement of the sealing capability of the sealing mechanism and also monitoring of the sealing situation. The interval between the packings 100 and 101 is connected with exhausting means 112 through a gas sensor 111 (leakage-detecting means). Note, the gas sensor 111 is electrically connected with the CPU 400, allowing the lowered sealing effect of the hollow packings 100, 101 to be detected (or monitored). When detecting (monitoring) the leakage of liquid, the gas sensor 111 may be replaced with a liquid sensor.

Note, since the other parts of the second embodiment are identical to those of the first embodiment, these elements are indicated with the same reference numerals of those parts respectively and their descriptions are eliminated.

In this way, the interval between the hollow packings 100 and 101 is connected with the exhausting means 112 through the gas sensor 111 for detecting the leakage and furthermore, the air between the hollow packings 100 and 101 is always exhausted and evacuated by the exhausting means 112 during the processing, that is, in the sealing condition owing to the hollow packings 100, 101. Therefore, if the sealing effect of the hollow packings 100, 101 is deteriorated to let the atmospheric gas in the processing chamber (the inner chamber 23) leak out through the interval between the hollow packings 100, 101, then the gas sensor 111 can detect such a situation. Further, if increasing the displacement of the exhausting means 112, then it is possible to enhance the sealing effect of the hollow packings 100, 101 since the inner cylinder 25 and the first stationary wall 34 are drawn together.

Additionally, as similar to the embodiments of FIGS. 5 and 6, the provision of the pressure-detecting switch 110 of the embodiment also allows of judgement of breakage of the packings, leakage in pressure, etc. due to the switch's detecting a fall in pressure. Thus, according to the embodiment, it is possible to perform the management for leakage doubly, thereby making sure of sealing state of the mechanism.

FIG. 8 is a schematic sectional view showing the sealing mechanism of the third embodiment of the invention. According to the third embodiment, the sealing mechanism 40B is provided with cooling function while planning to prolong the life of the hollow packings 100, 101 themselves.

In detail, the hollow parts 102 in the packings 100, 101 are connected with cooling-water sources 121 (pressurized-fluid source) through cooling-water supply tubes 120 respectively, while drain tubes 122 are connected with the hollow parts 102 in the packings 100, 101 as well. In this case, there are provided a closing valve 105A (closing means) and a flow meter 123 (flow-rate detecting means), both of which are interposed in each cooling-water supply tube 120, in order from the cooling-water source 121 toward the hollow packing 100 (or 101). As similar to the first and second embodiments, both of the flow meters 123 are connected with the CPU 400 electrically, allowing of detecting the breakage etc. of the hollow packings 100. Additionally, a drain valve 124 (closing means) and a variable choke 125 (flow-regulating means) are juxtaposed in each drain tube 122.

According to the sealing mechanism 40B constructed above, the closing valves 105A are opened to supply the hollow parts 102 in the hollow packings 100, 101 with cooling water from the sources 121, so that the hollow packings 100, 101 swell to come into close contact with the first stationary wall (not shown) for sealing. Simultaneously, since the cooling water in the hollow parts 102 of the packings 100, 101 is always drained at a predetermined flow rate due to the variable chokes 125, the hollow packings 100, 101 are cooled down by the cooling water. That is, it means enabling to prevent the temperature of the hollow packings 100, 101 from rising due to the processing chamber (the inner chamber 23) at high temperature, whereby the life of the sealing members themselves can be prolonged. Again, since the drain valve 124 and the variable choke 125 are juxtaposed in each drain tube 122, it is possible to control the displacement of the cooling water and also possible to let the cooling water flow through the drain valve 124 at the time of non-sealing. Additionally, even if the hollow packing 100 (or 101) is broken during the sealing operation, it is possible to drain the cooling water immediately with the opening of the corresponding drain valve 124. Thus, there is no possibility that the cooling water invades the inside of the processing chamber (the inner chamber 23).

Note, since the other parts of the third embodiment are identical to those of the first and second embodiments, these elements are indicated with the same reference numerals of those parts respectively and their descriptions are eliminated.

Figure 9A:
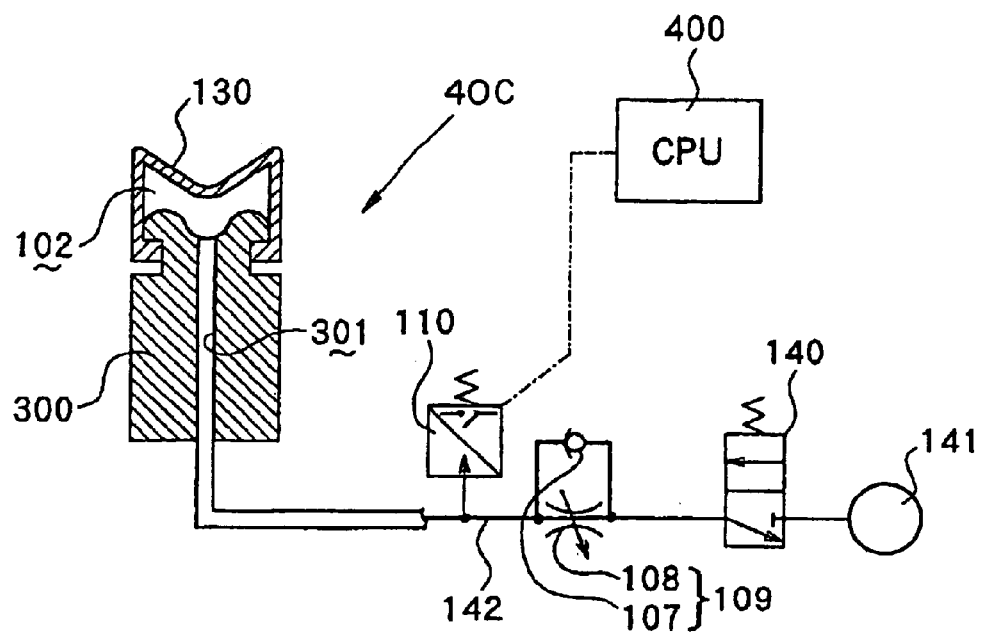
FIG. 9A is a sectional view of the essential part of the sealing mechanism in accordance with the fourth embodiment of the invention, showing its non-sealing state.
Figure 9B:
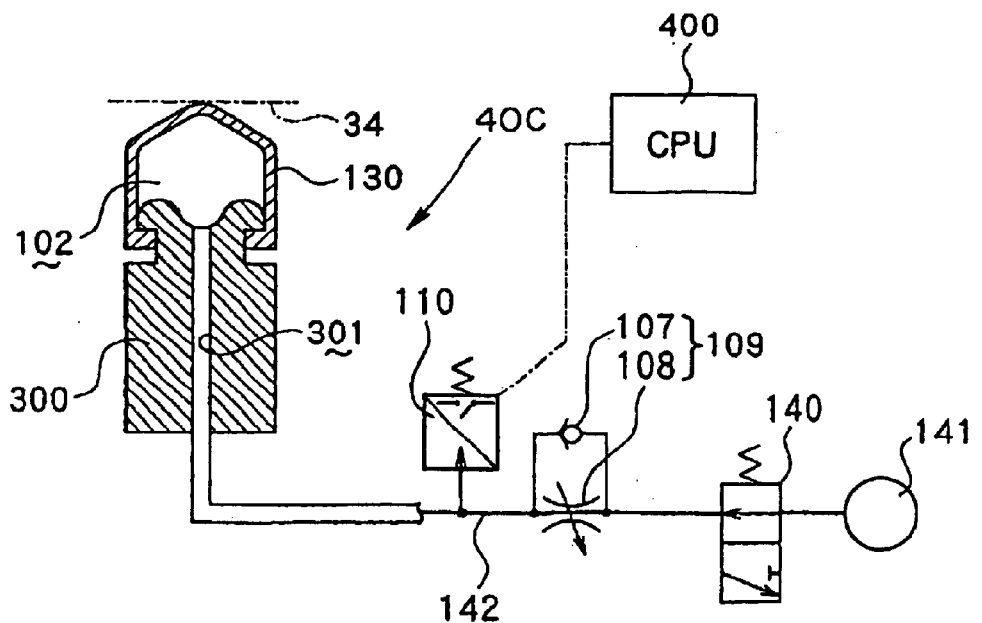
FIG. 9B is a sectional view of the essential part of the sealing mechanism of FIG. 9A, showing its sealing state.

FIGS. 9A and 9B are schematic sectional views of the sealing mechanism of the fourth embodiment of the invention, showing its non-sealing state and sealing state, respectively. According to the fourth embodiment of the invention, the hollow sealing member (the hollow packing) is deformed due to pressure of pressurized fluid for sealing.

That is, in the sealing mechanism 40C of the fourth embodiment, the inner cylinder 25 is provided with a hollow packing 130 (see FIG. 9A) capable of deformation against the first stationary wall (not shown) (the closing means) and the hollow part 102 of the deformable hollow packing 130 is connected with an air source 141 (pressure regulating means) through a closing switching valve 140 (closing switching means). In this arrangement, the deformable hollow packing 130 is adapted so as to usually have a concave section, for example, substantial M-shaped section in the non-compressed condition (non-sealing state). Note, in an air-supply tube 142 that connects the deformable hollow packing 130 with the air source 141, there are interposed the flow-regulating valve 109 and the pressure-detecting switch 110 (pressure-detecting means) in order from the air source 141 toward the hollow packing 130, as similar to the first embodiment. The pressure-detecting switch 110 is electrically connected with the CPU 400.

In this way, through the closing switching valve 140 and the pressure-detecting switch 110, the air source 141 is connected with the hollow part 102 of the deformable hollow packing 130 having a substantial M-shaped section at the non-compressed state. Under condition that the inner cylinder 25 is in the standby mode or moving, when the position of the closing switching valve 140 is shifted to its exhausting side, the supply of pressurized-air from the air source 141 is stopped to deform the deformable hollow packing 130 to have the substantial M-shaped section, realizing the non-contact condition between the deformable hollow packing 130 and the inner cylinder 25 (see FIG. 9A). Under condition that the inner cylinder 25 has been moved to its usable position, when the position of the closing switching valve 140 is shifted to its compressing side, the pressurized air from the air source 141 is fed to the hollow part 102 of the deformable hollow packing 130 for its convex shape, so that the packing 130 comes into close contact with the outer face of the first stationary wall 34, realizing a sealing condition between the first stationary wall 34 and the inner cylinder 25 (see FIG. 9B). In such a sealing condition, the breakage of the deformable hollow packing 130, deterioration in sealing effect, etc. are monitored by the pressure-detecting switch 110 and the CPU 400, as similar to the first embodiment. Note, if the position of the closing switching valve 140 is shifted to its exhausting side after completing the processing, then the deformable hollow packing 130 again deforms its section to a substantial-M shape, being apart from the outer face of the first stationary wall 34.

Thus, according to the sealing mechanism 40C of the fourth embodiment, since the small supply of compressed air from the air source 141 allows the deformable hollow packing 130 to be deformed convexly to maintain the sealing condition, it is possible to realize the ensured sealing condition by the hollow packing 130 in a single layer. While, when exhausting air in the hollow part 102, the deformable hollow packing 130 is deformed so as to have the substantial M-shaped section, thereby ensuring the non-contact between the packing and the first stationary wall 34. Thus, owing to the elimination of possibility that the deformable hollow packing 130 comes in frictional contact with the first stationary wall 34 (closing means) during moving the inner cylinder 25, it is possible to plan to prolong the life of the deformable hollow packing 130.

Although the above description relates to the single arrangement of the deformable hollow packing 130, the double arrangement of the packings 130 on the inner face of the inner cylinder 25 would allow the reliability of the sealing mechanism 40 to be progressed furthermore, as similar to the first and second embodiments. Then, the hollow parts 102 of the respective deformable hollow packings 130 are connected with the sir sources 141 through the air-supply tubes 142 each interposing the closing switching valve 140, the flow-regulating valve 109 and the pressure-detecting switch 110 in order from the air source 141 toward the hollow packing 130, as mentioned above.

Figure 10:
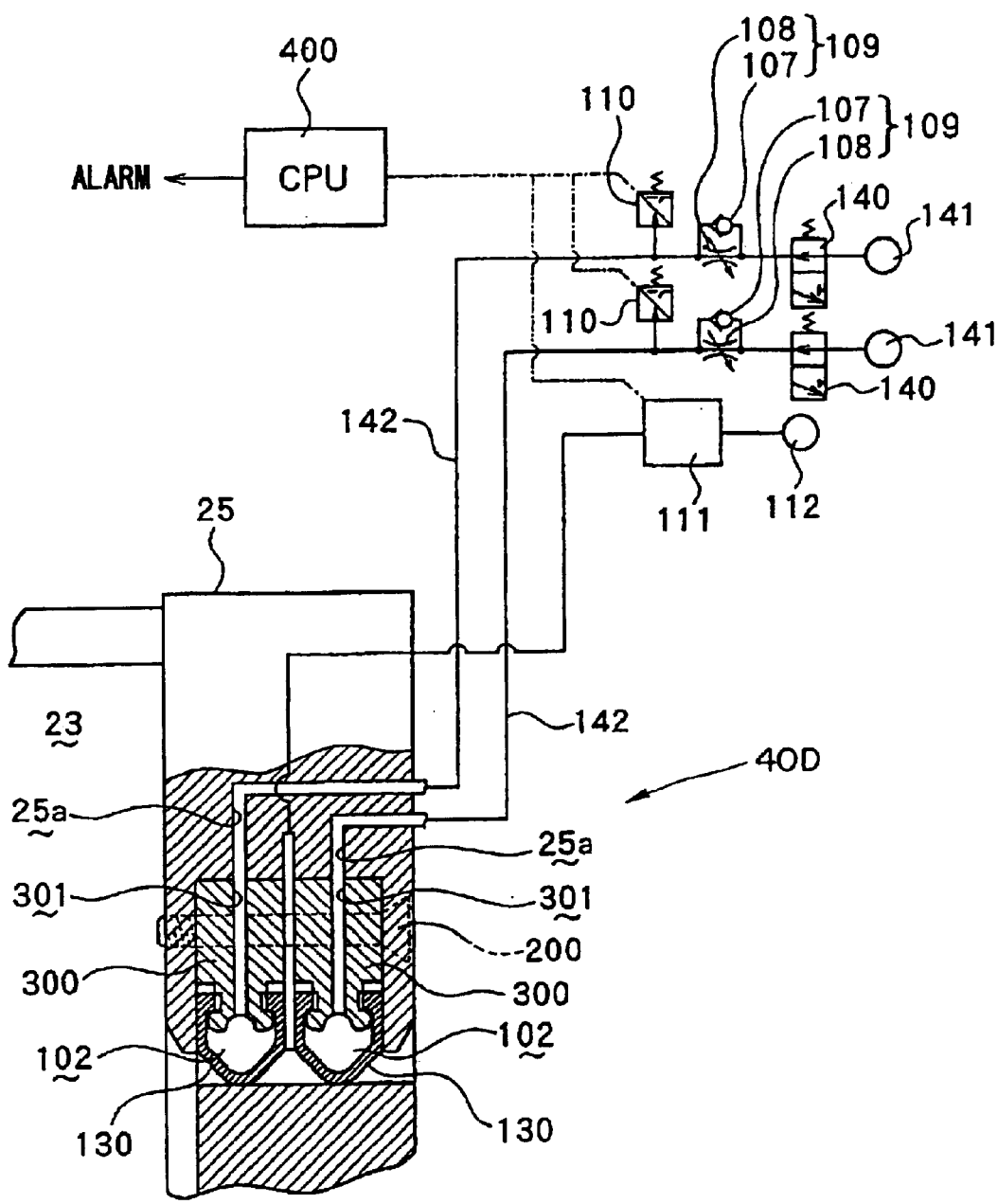
FIG. 10 is an enlarged sectional view of the essential part of the sealing mechanism in accordance with the modification of the fourth embodiment of FIGS. 9A and 9B, showing its sealing state.

In the shown double arrangement of the deformable hollow packings 130 of FIG. 10, it is preferable to connect the exhausting means 112 with the interval between the deformable hollow packings 130 through the gas sensor 111 (leakage detecting means), as similar to the second embodiment. Note, the gas sensor 111 is electrically connected with the CPU 400, allowing the deterioration in sealing effect of the packings 130 to be detected (or monitored).

Note, since the other parts of the fourth embodiment are identical to those of the first and second embodiments, these elements are respectively indicated with the same reference numerals of those elements of these embodiments and their descriptions are eliminated.

Also noted in the fourth embodiment, the deformable hollow packing(s) 130 in the non-compressed (non-sealing) state is formed with substantial-M shaped section: nevertheless the cross section may be modified to another form, for example, substantial U-shaped configuration.

Although the fourth embodiment has been described with reference to the deformable hollow packing(s) 130 capable of convex deformation in its compressed (sealing) state, the mechanism may be replaced with the sealing mechanism 40E adopting a deformable hollow packing that reverses its configuration between the non-compressed (non-sealing) condition and the compressed (sealing) condition.

For instance, as shown in FIGS. 11A and 11B, the mechanism may be provided, in place of the above packing 130, with a deformable hollow packing 130A usually having a convex section, e.g. reverse-U shaped section, on the inner wall at the end of the inner cylinder 25. The deformable hollow packing 130A has the hollow part 102 connected with a suction unit 150 through an intake tube 151 interposing a closing valve 105B (closing means). Note, the intake tube 151 further interposes the flow-regulating valve 109 and the pressure-detecting switch 110 between the closing valve 105B and the deformable hollow packing 130A, as similar to the fourth embodiment. The pressure-detecting switch 110 is electrically connected with the CPU 400.

With this constitution, the opening of the closing valve 105 at the non-compressed state allows the deformable hollow packing 130A to be deformed since the suction unit 150 sucks the air from the hollow part 102 of the hollow packing 130A (see FIG. 11B). While, when closing the closing valve 105B, then it causes the deformable hollow packing 130A to be restored convexly in section, whereby the compressed (sealing) condition can be realized (see FIG. 11A).

Further, it is also possible to employ the sealing mechanism 40F as shown in FIGS. 12A and 12B. That is, the deformable hollow packing 130A having a reverse U-shaped section may be replaced with a bellows-shaped deformable hollow packing 130B capable of usual sealing, as shown in FIGS. 12A and 12B.

Note, the other parts of FIGS. 12A and 12B are identical to those of FIGS. 11A and 11B, respectively. Therefore, these elements are respectively indicated with the same reference numerals of those elements and their descriptions are eliminated.

Although the arrangements where the hollow packings 100, 101 and the deformable hollow packings 130, 130A, 130B are respectively disposed in the inner cylinder 25 have been described, the hollow packings 100, 101 and the deformable hollow packings 130, 130A, 130B may be arranged in the first stationary wall 34 or the second stationary wall 38 (object to be closed by the inner cylinder 25).

Although the sealing mechanisms 40, 40A to 40F have been described in representative of the third sealing member 40a, the sealing mechanisms 40, 40A to 40F may be respectively applied to the second to fourth sealing members 40b to 40d as well.

Figure 13:
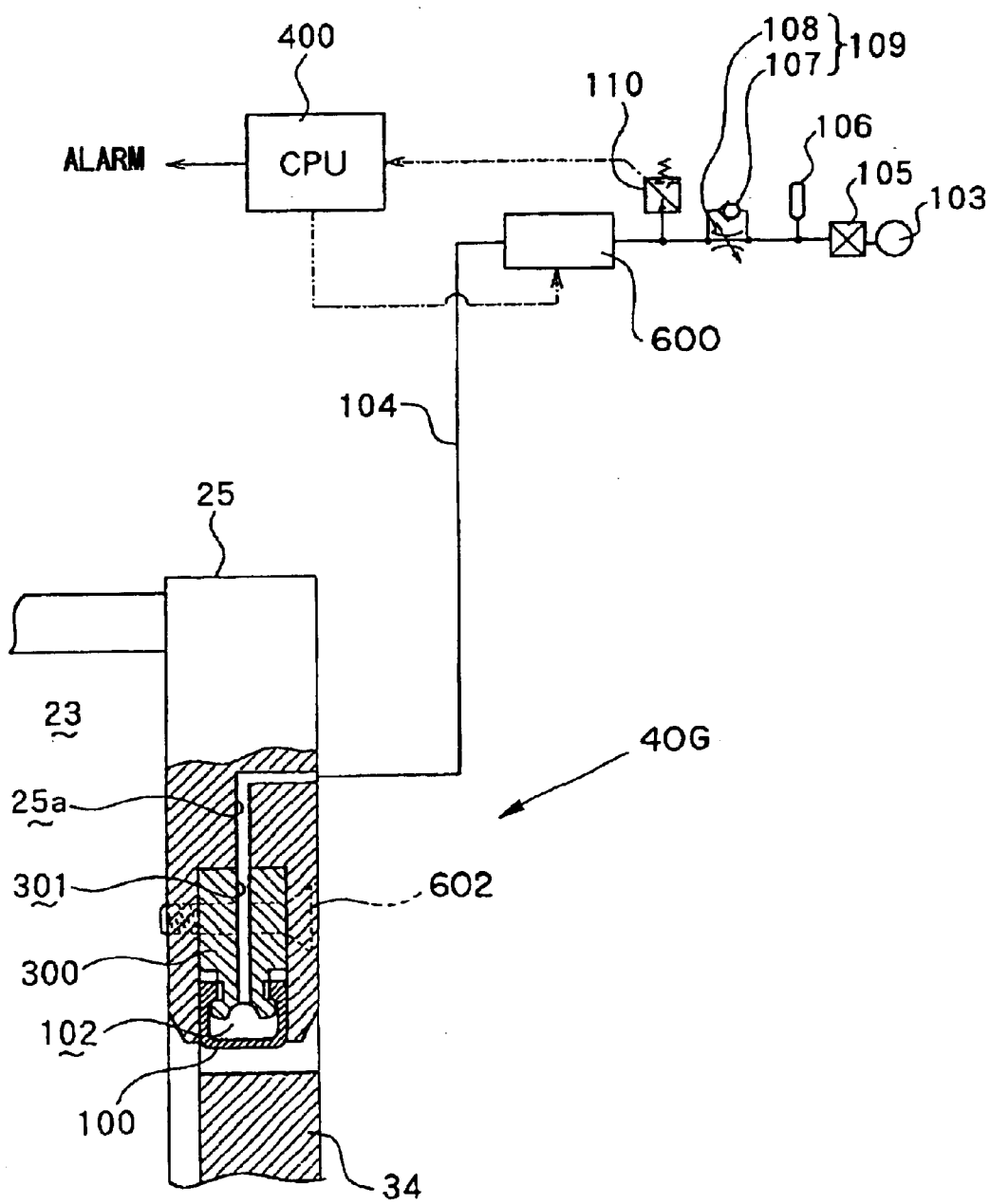
FIG. 13 is a sectional view of the essential part of the sealing mechanism in accordance with the fifth embodiment of the invention, showing its non-sealing state.
Figure 14:
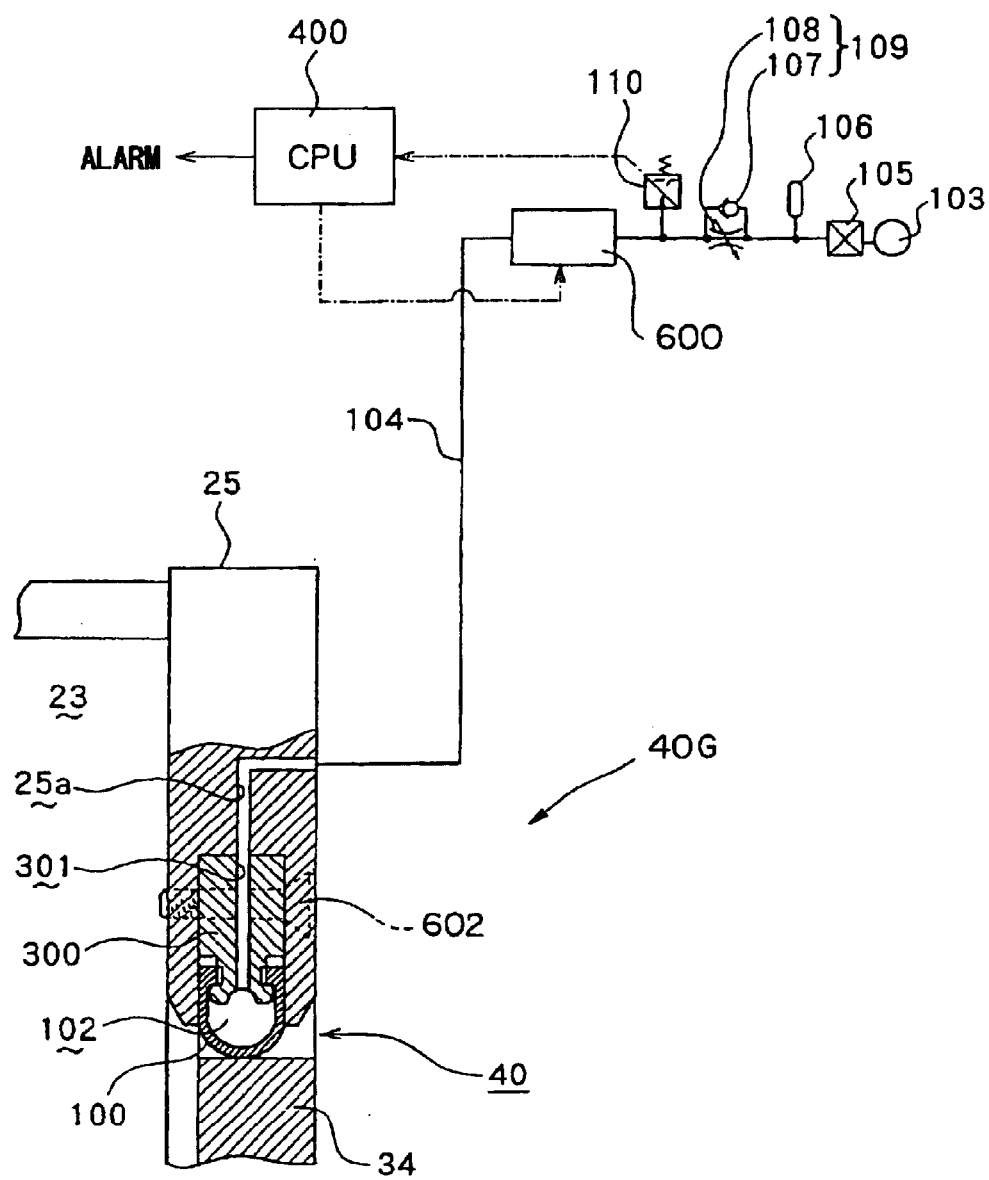
FIG. 14 is a sectional view of the essential part of the sealing mechanism of FIG. 13, showing its sealing state.

Additionally, the other sealing mechanisms will be described with reference to FIGS. 13 to 19, in detail. FIG. 13 is a schematic sectional view of the sealing mechanism of the fifth embodiment of the invention, showing its pre-sealing state. FIG. 14 is a schematic sectional view of the fifth embodiment, showing its sealing state.

This sealing mechanism 40G is also applicable to each of the afore-mentioned hollow sealing members 40a to 40d (the mechanism will be also described in representative of the hollow sealing member 40a hereinafter). This sealing mechanism 40G includes the hollow sealing member 100 (referred "hollow packing 100" hereinafter) arranged on the inner face of the end of the inner cylinder 25 through the attachment block 300 fitted to the end of the inner cylinder 25 by attachment screws 602. The hollow packing 100 has its hollow part 102 connected with a pressurized-fluid source, for example, the air source 103 through the air supply tube 104.

Note, the air supply tube 104 is connected with the packing through the passage 301 formed in the block 300 and also the communication passage 25a formed in the inner cylinder 25 so as to communicate with the passage 301. Interposed in the air supply tube 104 in order from the air source 103 toward the hollow packing 100 are the following elements: the closing valve 105 (closing means), the accumulator 106, the flow-regulating valve 109 constituted by the check valve 107 and the variable choke 108, the pressure-detecting switch 110 (pressure detecting means), and a heat regulator 600 (temperature-regulating means).

In this case, the heat regulator 600 is formed by e.g. a heat exchanger for circulating heat medium in a heat-exchanging tube in the vicinity of the air supply tube 104, an electric heat exchanger using Peltier elements and so on. Based on control signals from the control means, for example, the central processing unit 400 (it will be referred "CPU 400" after), the heat regulator 600 is adapted so as to control the air forming the pressurized fluid at a designated temperature. In connection, the inner chamber (processing chamber) 23 may be provided, therein, with a temperature sensor (not shown) that transmits a detection signal to the CPU 400. Subsequently, by comparing the information from the sensor with temperature data previously stored in the CPU 400, the control signals are transmitted to the heat regulator 600. In the shown arrangement, the pressure-detecting switch 100 is electrically connected with the CPU 400. The detection signal from the pressure-detecting switch 100 is transmitted to the CPU 400 for generating a signal, such as alarm.

According to the sealing mechanism 40G constructed above, under the non-sealing condition shown in FIG. 13, the closing valve 105 is closed to stop the air supply from the air source 103, so that the hollow packing 100 in their shrunk state retreats apart from the first stationary wall 34. Accordingly, the inner cylinder 25 is capable of moving to both of the processing position and the standby position without contacting with the hollow packing 100. While, the closing valve 105 is opened under the sealing condition of FIG. 14. Then, the air from the air source 103 is pressurized due to the synergistic effect of air being accumulated in the accumulator 106. Further, the temperature of air is adjusted by the heat regulator 600 at a designated temperature, e.g. 40° C. and subsequently, the air is supplied to the hollow part 102 of the hollow packing 100. Owing to this pressurized air, the hollow packing 100 is inflated to closely contact with the first stationary wall 34, so that the leak-tight condition can be maintained between the inner cylinder 25 and the first stationary wall 34. In this sealing condition, the temperature of air supplied into the hollow part 102 of the hollow packing 100 can be maintained at 40° C. even through the interior of the inner chamber (the processing chamber) 23 is exposed to high-temperature atmosphere of e.g. 80° C. Therefore, there is no possibility that the hollow packing 100 is hardened or softened unsuitably for its expansion and contraction. With the establishment of suitable sealing condition, there is no possibility that the atmosphere in the first processing chamber (the inner chamber 23) leaks out. In connection, when the pressure in the hollowing part 102 of the hollow packing 100 is lowered, the pressure-detecting switch 110 detects the pressure-reduced state to transmit the detection signal to the CPU 400. Thus, the control signal (alarm etc.) from the CPU 400 allows the breakage etc. of the hollow packing 100 to be detected. It means enabling to exchange or repair the broken packing 100, for example, in advance of the next-coming processing.

Figure 15:
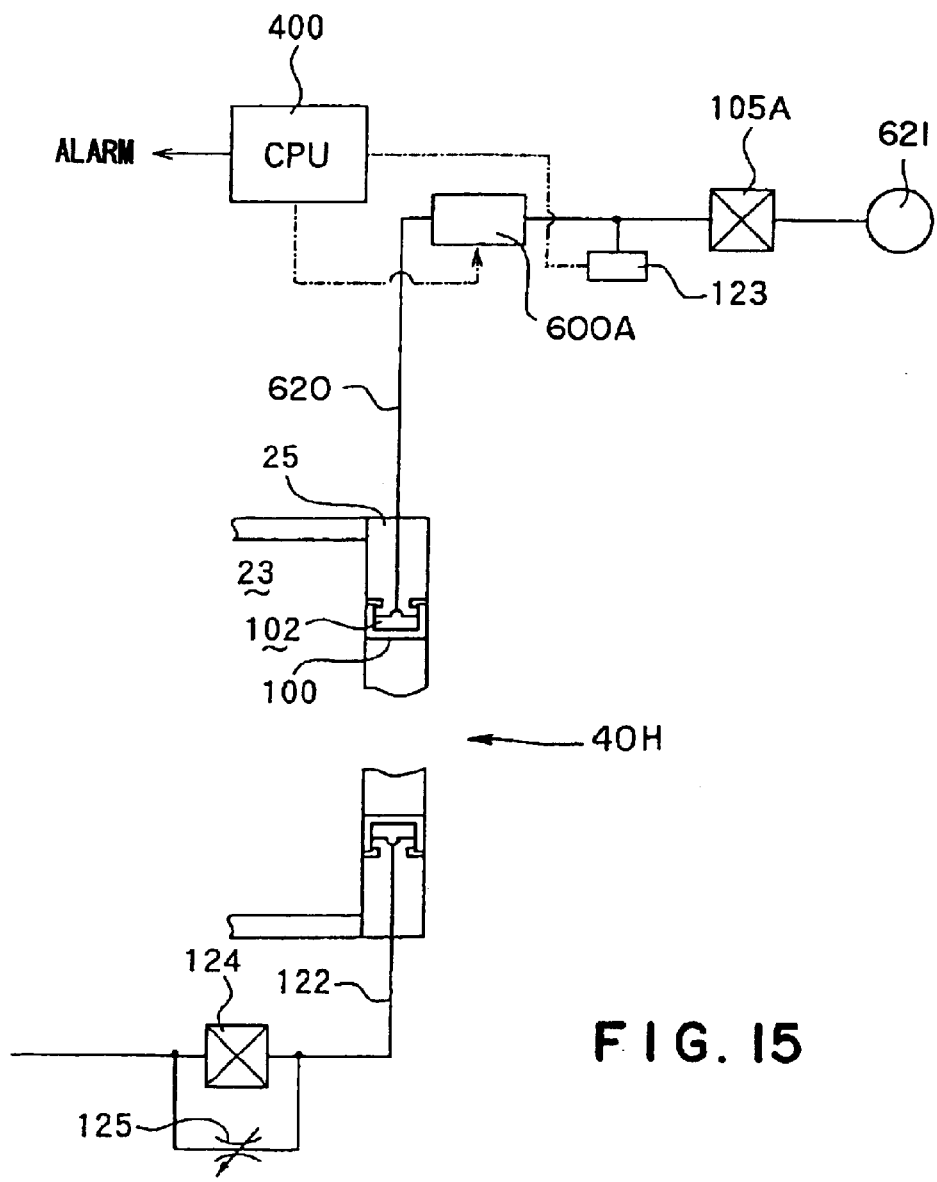
FIG. 15 is a schematic sectional view of the sealing mechanism in accordance with the sixth embodiment of the invention.

FIG. 15 is a schematic sectional view showing the sealing mechanism of the sixth embodiment of the invention. According to the sixth embodiment, the sealing mechanism is provided for purposes of further improving its sealing capability while planning to prolong the life of the hollow packing 100 itself.

In this sealing mechanism 40H, the hollow part 102 in the packing 100 is connected with a pure-water source 621 (pressurized-fluid source) through a pure-water supply tube 620 (supply pipeline), while the drain tube 122 is connected with the hollow part 102 in the packing 100 as well. In the pure-water supply tube 620, the mechanism includes the closing valve 105A (closing means), the low meter 123 (pressure-detecting means) and a heat regulator 600A, in order from the pure-water source 621 toward the hollow packing 100. As similar to the fifth embodiment, the flow meter 123 is connected with the CPU 400 electrically, allowing of detecting the breakage etc. of the hollow packing 100. Similarly to the fifth embodiment, the heat regulator 600A is formed by e.g. a heat exchanger that circulates heat medium in a heat-exchanging tube in the vicinity of the pure-water supply tube 620, an electric heat exchanger using Peltier elements, etc. Based on control signals from the CPU 600A, the heat regulator 600 is adapted so as to control the pure water (pressurized fluid) at a designated temperature. In connection, the inner chamber (processing chamber) 23 may be provided, therein, with a temperature sensor (not shown) that transmits a detection signal to the CPU 400. Subsequently, by comparing the information from the sensor with temperature data previously stored in the CPU 400, the control signals are transmitted to the heat regulator 600A. Additionally, the drain valve 124 (closing means) and the variable choke 125 (flow-regulating means) are juxtaposed in the drain tube 122.

According to the sealing mechanism 40H constructed above, the closing valve 105A is opened to let the pure water of the pure-water source 621 flow in the pure-water supply tube 620 and the temperature of pure water is controlled by the heat regulator 600A at a predetermined temperature, e.g. 40° C. With the supply of pure water into the hollow part 102 of the hollow packing 100, it swells to come into close contact with the first stationary wall (not shown) for sealing. Simultaneously, since the pure water in the hollow part 102 of the packing 100 is always drained at a predetermined flow rate due to the variable choke 125, the hollow packing 100 is maintained at the designated temperature by the pure water. That is, since the supply of a predetermined quantity of pure water allows the deformation (expansion, contraction) of the packing 100 to be adjusted precisely, the sealing capability can be maintained without providing the packing with surplus pressure, in other words, surplus pure water. Additionally, since it means enabling to prevent the temperature of the hollow packing 100 from rising due to the processing chamber (the inner chamber 23) at high temperature (e.g. 80° C.), the life of the sealing member itself can be prolonged. Again, since the drain valve 124 and the variable choke 125 are juxtaposed in the drain tube 122, it is possible to control the displacement of the pure water and also possible to let the pure water flow through the drain valve 124 at the time of non-sealing. Additionally, even if the hollow packing 100 is broken during the sealing operation, it is possible to drain the pure water immediately with the opening of the drain valve 124. Thus, there is no possibility that the pure water invades the inside of the processing chamber (the inner chamber 23). Note, the pure water to be drained may be reused in circulation.

Note, since the other parts of the sixth embodiment are identical to those of the fifth embodiment, these elements are respectively indicated with the same reference numerals of those elements of the fifth embodiment and their descriptions are eliminated.

Although, in the above description, the hollow packing 100 is provided with the inner cylinder 25, the hollow packing 100 may be provided with the first stationary wall 34 or the second stationary wall 38 which is sealed with the hollow packing 100.

Figure 16A:
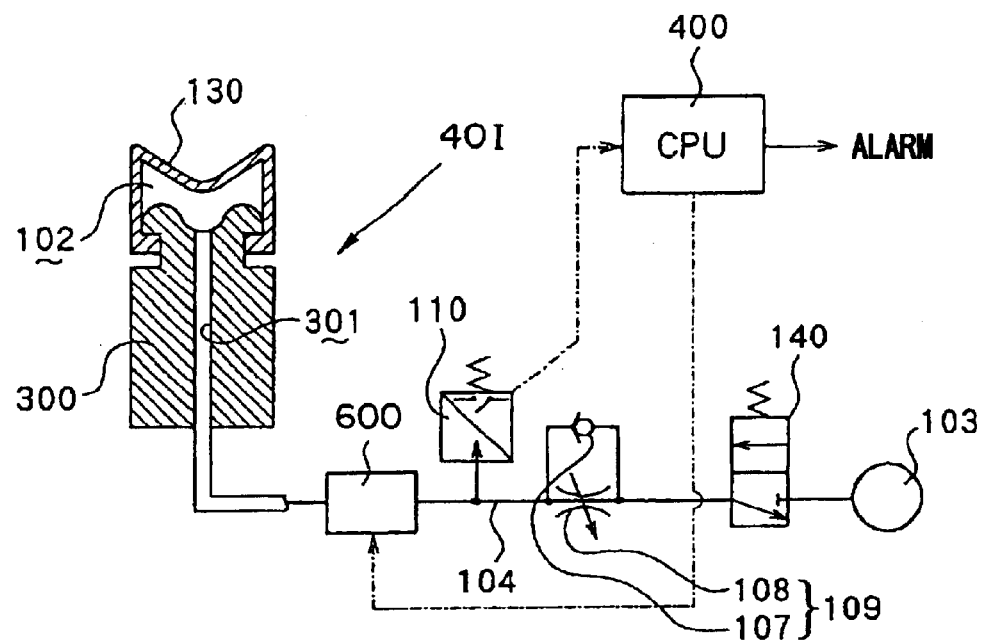
FIG. 16A is a schematic sectional view of the sealing mechanism in accordance with the seventh embodiment of the invention, showing its non-sealing state.
Figure 16B:
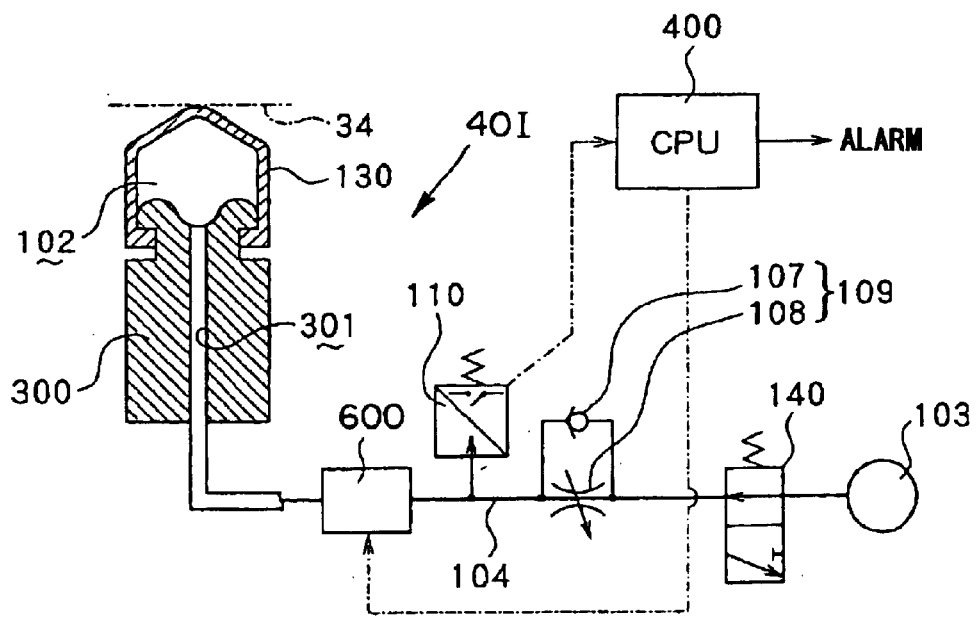
FIG. 16B is a schematic sectional view of the sealing mechanism of FIG. 16A, showing its sealing state.

FIG. 16A and FIG. 16B are schematic sectional views of the heat-regulating sealing mechanism of the seventh embodiment of the invention, showing its non-sealing state and sealing state, respectively. According to the seventh embodiment of the invention, the hollow sealing member (the hollow packing) is deformed with small pressure of pressurized fluid, for sealing.

That is, in the sealing mechanism 40I of the seventh embodiment, the inner cylinder 25 is provided with the hollow packing 130 (see FIG. 16A) capable of deformation against the first stationary wall (not shown) (closing means) and the hollow part 102 of the deformable hollow packing 130 is connected with the pressurized-fluid source, i.e., the air source 103 through the closing switching valve 140 (closing switching means). In this arrangement, the deformable hollow packing 130 is adapted so as to usually have a concave section, for example, substantial M-shaped section in the non-compressed condition (non-sealing state). Note, in the air-supply tube 104 that connects the deformable hollow packing 130 with the air source 103, there are interposed the closing switching valve 140, the flow-regulating valve 109, the pressure-detecting switch 110 (pressure-detecting means) and the heat regulator 600 (heat regulating means) in order from the air source 103 toward the deformable hollow packing 130. Further, as similar to the fifth embodiment, the heat regulator 600 is adapted, on a basis of control signals from the CPU 400, so as to adjust the air (pressurized fluid) at a designated temperature. Also, the pressure-detecting switch 110 is electrically connected with the CPU 400.

In this way, through the closing switching valve 140, the pressure-detecting switch 110 and the heat regulator 600, the air source 103 is connected with the hollow part 102 of the deformable hollow packing 130 having a substantial M-shaped section at the non-compressed state. Under condition that the inner cylinder 25 is in the standby mode or moving, when the position of the closing switching valve 140 is shifted to its exhausting side, the supply of pressurized-air from the air source 141 is stopped to deform the deformable hollow packing 130 to have the substantial M-shaped section, realizing the non-contact condition between the deformable hollow packing 130 and the first stationary wall 34 (see FIG. 16A). Under condition that the inner cylinder 25 has been moved to its operative position, when the position of the closing switching valve 140 is shifted to its compressing side, the pressurized air of controlled temperature is supplied from the air source 103 to the hollow part 102 of the deformable hollow packing 130 for its convex shape, so that the packing 130 comes into close contact with the outer face of the first stationary wall 34, realizing a sealing condition between the first stationary wall 34 and the inner cylinder 25 (see FIG. 16B). Under this sealing condition, as similar to the fifth embodiment, the deformable hollow packing 130 is maintained at a designated temperature by the heat regulator 600 and the CPU 400. Additionally, the breakage of the deformable hollow packing 130, deterioration in sealing effect, etc. are monitored by the pressure-detecting switch 110 and the CPU 400. Note, if the position of the closing switching valve 140 is shifted to its exhausting side after completing the processing, then the deformable hollow packing 130 again deforms its section to a substantial-M shape, being apart from the outer face of the first stationary wall 34.

Thus, according to the sealing mechanism 40I of the seventh embodiment, since the small supply of compressed air from the air source 103 allows the deformable hollow packing 130 to be deformed convexly to maintain the sealing condition, it is possible to realize the ensured sealing condition. While, when exhausting air in the hollow part 102, the deformable hollow packing 130 is deformed so as to have the substantial M-shaped section, thereby ensuring the non-contact between the packing and the first stationary wall 34. Thus, owing to the elimination of possibility that the deformable hollow packing 130 comes in frictional contact with the first stationary wall 34 (closing means) during moving the inner cylinder 25, it is possible to plan to prolong the life of the deformable hollow packing 130.

Note, since the other parts of the seventh embodiment are identical to those of the fifth and sixth embodiments, these elements are respectively indicated with the same reference numerals of those elements of the embodiments and their descriptions are eliminated.

Figure 17:
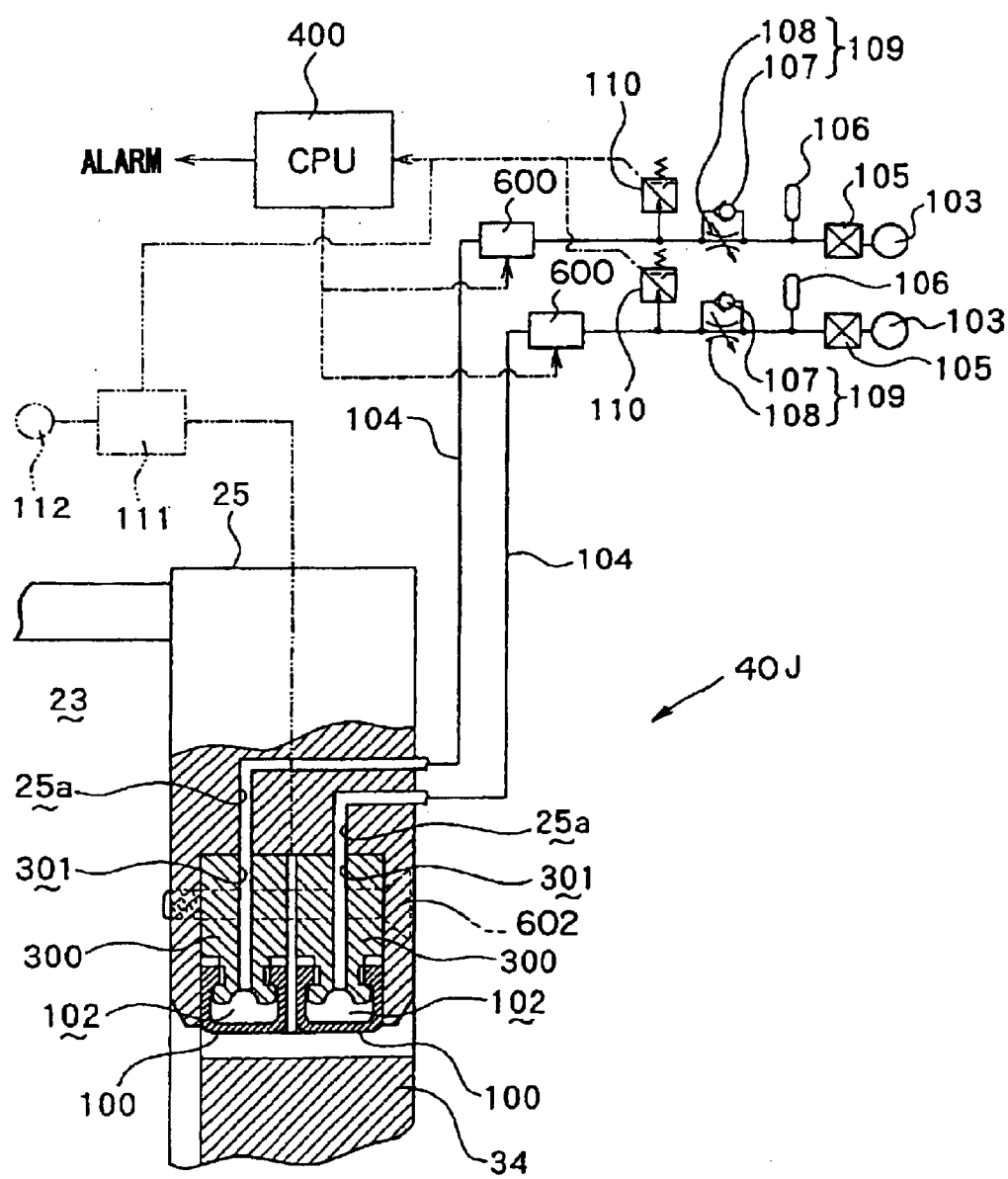
FIG. 17 is a schematic sectional view of the sealing mechanism in accordance with the eighth embodiment of the invention, showing its non-sealing state.
Figure 18:
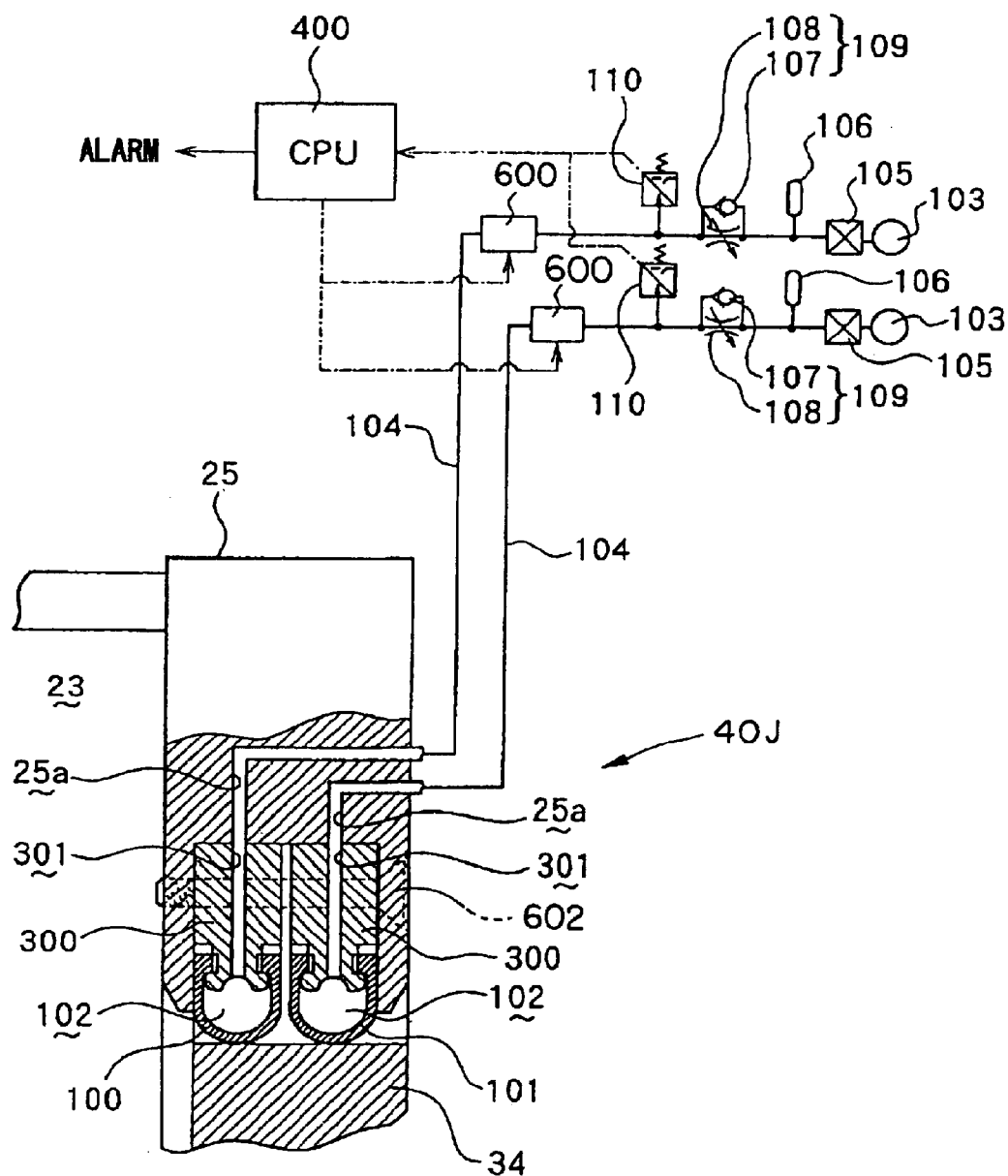
FIG. 18 is a schematic sectional view of the embodiment of FIG. 17, showing the sealing state.

FIG. 17 is a schematic sectional view of the heat-regulating sealing mechanism of the eighth embodiment of the invention, showing its non-sealing state. FIG. 18 is a schematic sectional view of the heat-regulating sealing mechanism of the eighth embodiment of the invention, showing its sealing state.

The sealing mechanism 40J of the eighth embodiment is directed to both improve its sealing capability and prolong the life of the mechanism by doubling the hollow sealing member (hollow packings) of the fifth embodiment.

The sealing mechanism 40J of the eighth embodiment includes the hollow packings 100 doubly-arranged through two attachment blocks 300 fitted by attachment screws 602. Each hollow packing 100 has its hollow part 102 connected with a pressurized-fluid source, such as air source 103, through the air supply tube 104.

Note, each air supply tube 104 is connected with the attachment block 300 through the passage 301 formed therein and also the communication passage 25a. The communication passage 25a is formed in the inner cylinder 25 so as to communicate with the passage 301. Interposed in each air supply tube 104 are the following elements: the closing valve 105 (closing means); the accumulator 106; the flow-regulating valve 109 consisting of the check valve 107 and the variable choke 108; the pressure-detecting switch 110; and the heat regulator 600, in order from the air source 103 toward the hollow packing 100. As similar to the arrangement of the fifth embodiment, the heat regulator 600 is adapted so as to adjust air as the pressurized fluid at a designated temperature, based on the control signals from the CPU 400. The pressure-detecting switches 110 are together connected with the CPU 400 electrically.

According to the sealing mechanism 40J constructed above, under the non-sealing condition shown in FIG. 17, both closing valves 105 are closed to stop air-supply from the air sources 103, so that both hollow packings 100 in their shrunk condition are withdrawn from the first stationary wall 34. Accordingly, the inner cylinder 25 is capable of moving to both processing position and standby position with no contact of the hollow packings 100. While, under the sealing condition of FIG. 18, the closing valves 105 are together opened to supply air into the hollow parts 102 of the hollow packings 100. Then, the air from the air sources 103 is pressurized by the synergistic effect of air accumulated in the accumulators 106 and further adjusted at a predetermined temperature, e.g. 40° C. by the heat regulators 600. By the pressurized air, both hollow packings 100 are inflated to come into close contact with the first stationary wall 34, so that the leak-tight condition can be maintained between the inner cylinder 25 and the first stationary wall 34. In this sealing condition, the temperature of air supplied into the hollow parts 102 of both hollow packings 100 can be maintained at 40° C. even through the interior of the inner chamber (the processing chamber) 23 is exposed to high-temperature atmosphere of e.g. 80° C. Therefore, there is no possibility that the hollow packings 100 are hardened or softened unsuitably for their expansion and contraction. With the establishment of suitable sealing condition, there is no possibility that the atmosphere in the first processing chamber (the inner chamber 23) leaks out. Additionally, even if one hollow packing 100 is broken in this sealing condition, the other hollow packing 100 maintains the sealing condition, so that there is no fear of leakage of atmosphere in the first processing chamber (the inner chamber 23). In connection, when the pressure in the hollowing part 102 of the hollow packing 100 falls, the pressure-detecting switch 110 detects such a pressure-reduced state and also transmits the detection signal to the CPU 400 thereby to allow the breakage etc. of the hollow packing 100 to be detected by the control signal (alarm etc.) from the CPU 400. It means enabling to exchange or repair the broken packing 100, for example, in advance of the next-coming processing.

Note, since the other parts of the eighth embodiment are identical to those of the fifth to seventh embodiments, these elements are respectively indicated with the same reference numerals of those elements of the embodiments and their descriptions are eliminated.

Figure 19:
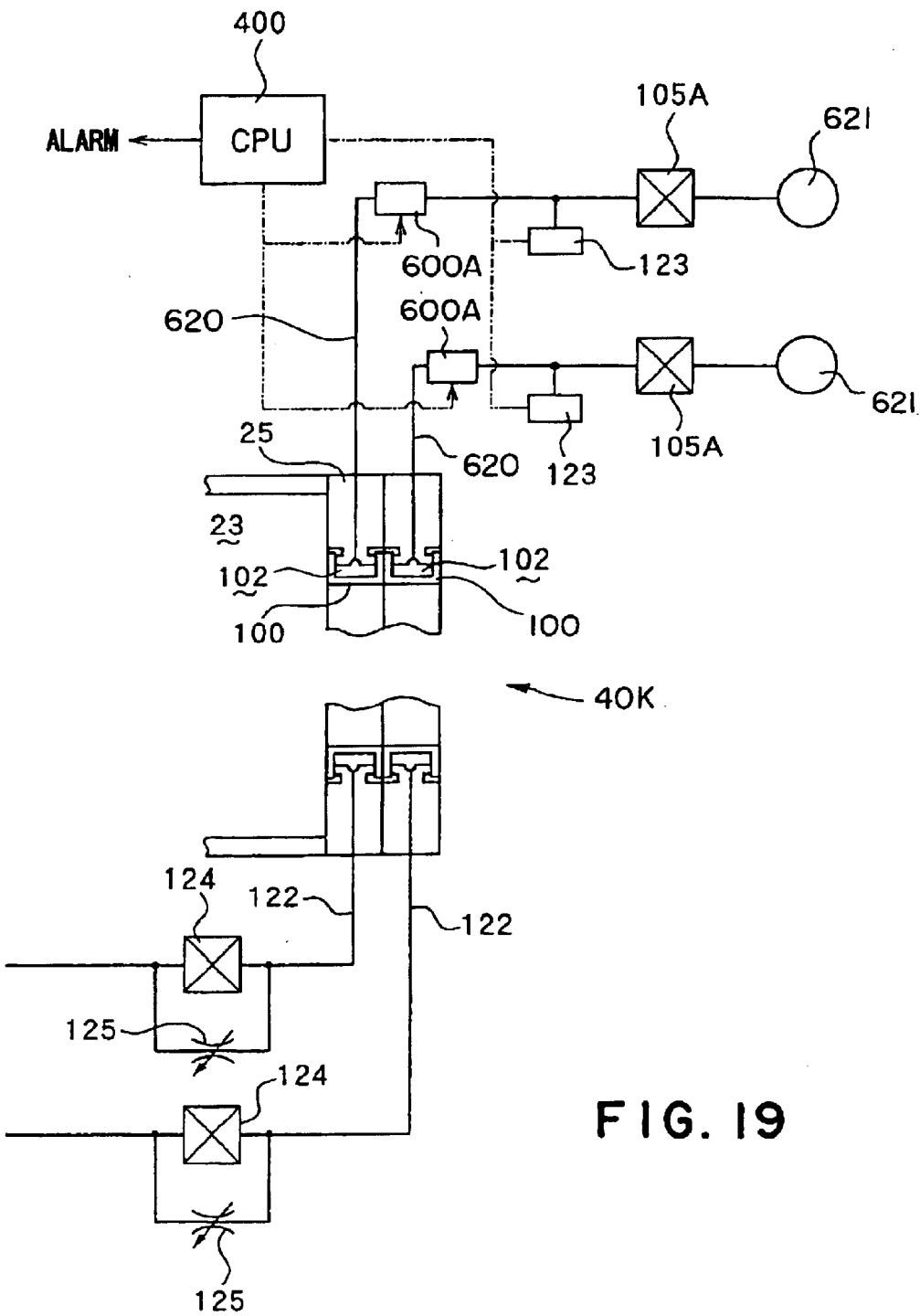
FIG. 19 is a schematic sectional view showing the sealing mechanism in accordance with the ninth embodiment of the invention.

FIG. 19 is a schematic sectional view of the heat-regulating sealing mechanism of the ninth embodiment of the invention.

The ninth embodiment is directed to both improve its sealing capability and prolong the life of the mechanism by doubling the hollow sealing member (hollow packings) of the sixth embodiment.

In this sealing mechanism 40K, the hollow parts 102 in the packings 100 are connected with the pure-water sources 621 (pressurized-fluid source) through the pure-water supply tubes 620 respectively, while the drain tubes 122 are connected with the hollow parts 102 in the packings 100 as well. In each pure-water supply tube 620, the mechanism interposes the closing valve 105A (closing means), the low meter 123 (pressure-detecting means) and the heat regulator 600, successively from the pure-water source 621 toward the hollow packing 100. As similar to the second embodiment, the flow meters 123 are connected with the CPU 400 electrically, allowing of detecting the breakage of both hollow packings 100. Similarly to the fifth to eighth embodiments, each heat regulators 600A is adapted so as to adjust pure water as the pressurized fluid at a designated temperature, based on the control signals from the CPU 400. Additionally, the drain valve 124 (closing means) and the variable choke 125 (flow-regulating means) are juxtaposed in each drain tube 122.

According to the sealing mechanism 40K constructed above, the closing valves 105A are opened to let the pure water of the pure-water sources 621 flow in the pure-water supply tubes 620 and furthermore, the temperature of pure water is controlled by the heat regulator 600A at a predetermined temperature, e.g. 40° C. With the supply of pure water into the hollow parts 102 of both hollow packings 100, they swell to come into close contact with the first stationary wall (not shown) for sealing. Simultaneously, since the pure water in each hollow part 102 of the packings 100 is always drained at a predetermined flow rate due to the variable choke 125, the hollow packings 100 are maintained at the designated temperature by the pure water. That is, since the supply of a predetermined quantity of pure water allows the deformation (expansion, contraction) of the hollow packings 100 to be adjusted precisely, the sealing capability can be maintained without providing the packing with surplus pressure, in other words, surplus pure water. Additionally, since it means enabling to prevent the temperature of the hollow packings 100 from rising due to the processing chamber (the inner chamber 23) at high temperature (e.g. 80° C.), the life of the sealing members themselves can be prolonged. Again, since the drain valve 124 and the variable choke 125 are juxtaposed in each drain tube 122, it is possible to control the displacement of the pure water and also possible to let the pure water flow through the drain valves 124 at the time of non-sealing. Additionally, even if the hollow packings 100 are broken during the sealing operation, it is possible to immediately drain the pure water with the opening of the drain valves 124. Thus, there is no possibility that the pure water invades the inside of the processing chamber (the inner chamber 23).

Note, since the other parts of the ninth embodiment are identical to those of the fifth to eighth embodiments, these elements are respectively indicated with the same reference numerals of those elements of the embodiments and their descriptions are eliminated.

Note, the deformable hollow packing 130 of the seventh embodiment may be doubled in arrangement, as similar to the eighth and ninth embodiments.

In the arrangement where the hollow packings 100 or the deformable hollow packings 130 are arranged double, preferably, the exhausting means 112 is connected with the interval between both hollow packings 100 (or the deformable hollow packings 130) through the gas sensor 111 (leakage-detecting means), as shown with two-dot chain line of FIG. 17. Then, by connecting the gas sensor 111 with the CPU 400 electrically, it becomes possible to detect (or monitor) the deterioration in sealing effect of the hollow packings 100 (or the deformable hollow packings 130).

Although the sealing mechanisms 40A to 40J have been described in representative of the first sealing member 40a, the above sealing mechanisms 40, 40A, etc. may be applied to the other (second-fourth) sealing members 40b to 40d as well.

In addition to the above-mentioned sealing mechanisms, a further sealing mechanism will be described as follows.

FIGS. 20 to 23 are view showing respective double hollow packings. The double hollow packing 701 of FIG. 20 has an outside packing 703 and an inside packing 705. A space 707 defined between the outside packing 703 and the inside packing 705 is supplied with cooled pressurized fluid, while another space 709 inside the inside packing 705 is supplied with pressurized fluid of a normal temperature. With this structure that the hollow packing includes, it is possible to prevent the overheating of respective packings, thereby improving the life of the hollow packing.

The double hollow packing 711 of FIGS. 21 to 23 consists of an outside packing 713 having the property of chemical resistance and an inside packing 715 that does not have the property of chemical resistance particularly. The double hollow packing 711 has a space 717 defined between the outside packing 713 and the inside packing 715 and another space 719 defined inside the inside packing 715.

In this structure, both of the spaces 717, 719 are normally supplied with pressurized fluids of the same pressure by pressurized-fluid sources 721, 723, respectively. In this state, since the same pressure is applied on the space 717 and the space 719, no load is applied on the inside packing 715 due to the equilibrium of inside and outside forces. Therefore, the inside packing 715 is subjected to less mechanical fatigue or deterioration, allowing of the long life span. On the other hand, the outside packing 713 representing the chemical resistance is forced by a sealing face S to perform a sealing operation.

Note, although the arrangements of FIGS. 21 to 23 are respectively provided with two pressurized-fluid sources 721 and 723, there may be formed a supply pipeline which branches from one pressurized-fluid source into the spaces 717, 719 to supply the pressurized fluid. Then, it becomes possible to supply the spaces 717, 719 with the pressurized fluid with simple structure.

Hereat, it is assumed that the outside packing 713 is subjected to repeated mechanical loads or effect of chemicals thereby producing cracks.

Then, as shown in FIG. 22, the inside packing 715 swells toward the space 717 having a reduced pressure to press the sealing face S through the outside packing 713, as shown in FIG. 23. That is, even if the outside packing 713 is torn, the inside packing 715 immediately swells to ensure the sealing condition for the time being.

In this way, according to the double follow packing 711, it is possible to reduce its manufacturing cost because the extraordinary-used inside packing 715 may be made from normal material although the outside packing 713 has to be formed with chemical resistance. Again, if the outside packing is broken, then the inside packing 715 automatically accomplishes the sealing function and therefore, it is possible to improve the availability factor of the apparatus with no standstill thereof.

FIG. 24 and FIG. 25 shows one sealing mechanism where a pressurized-gas source 735 is connected with a hollow packing 731 through a switching valve 733, while a vacuum source 739 is connected with the hollow packing 731 through a switching valve 737. In this sealing mechanism, at the sealing operation, the switching valve 733 is opened while closing the switching valve 737 thereby to cause the hollow packing 731 to positively swell for sealing. To the contrary, at the non-sealing operation, the switching valve 737 is opened while closing the switching valve 733 thereby to cause the hollow packing 731 to positively shrink for canceling the sealing. With this arrangement, since the hollow packing 731 is not required to have particular rigidity, it is possible to improve the degree of freedom in design of the hollow packing in terms of its thickness, material, etc.

FIG. 26 shows a hollow packing 743 provided, on its side contacting with the sealing face S, with a ridge 741. Owing to this formation, it is possible to press the ridge 714 to the sealing face S certainly, thereby improving the sealing capability.

Figure 27:
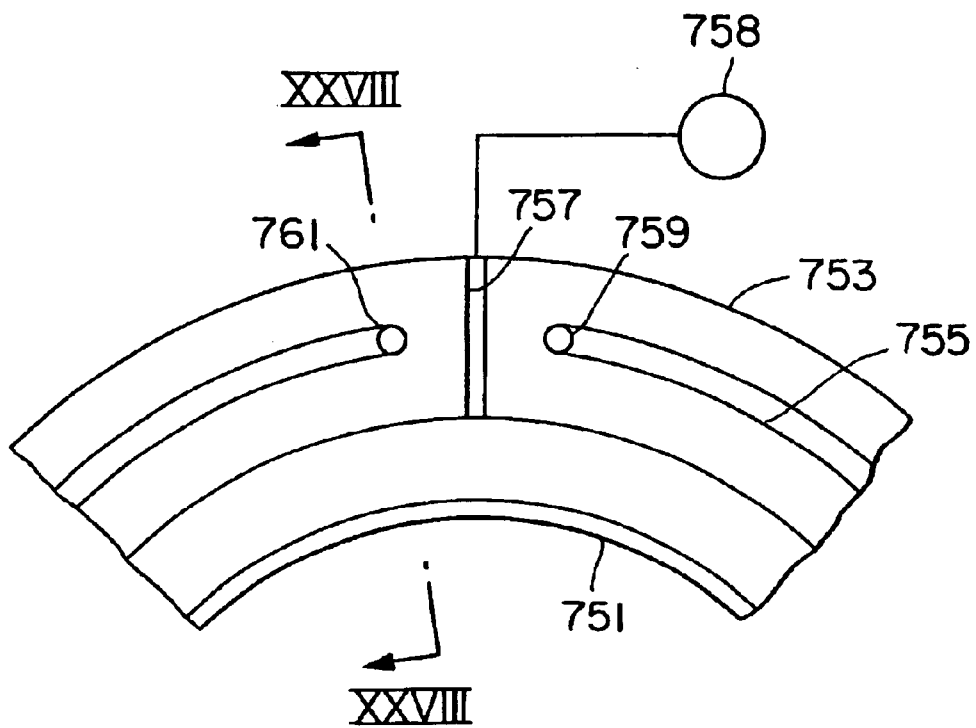
FIG. 27 is a sectional view showing one example of the sealing mechanism having a cooling fluid passage formed in an attachment block.
Figure 28:
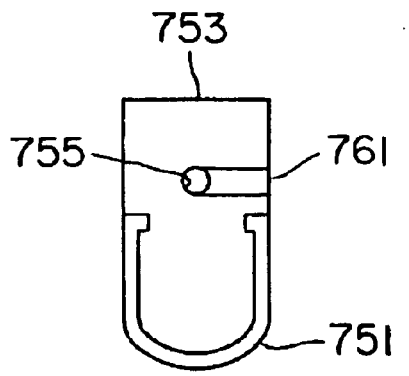
FIG. 28 is a view showing a section taken along a line XXVIII—XXVIII of FIG. 27.

FIGS. 27 and 28 show a structure where a coolant passage 755 for passage of cooling fluid is formed in an attachment block 753 retaining a hollow packing 751. The attachment block 753 has a pressurized-fluid passage 757 formed in the radial direction to supply the interior of the hollow packing 751 with pressurized-fluid, such as $N_2$, air. The pressurized-fluid passage 757 is connected with a pressurized-fluid source 758. On both sides of the pressurized-fluid passage 757 in the circumferential direction, there are respectively provided a coolant inlet 759 and a coolant outlet 761 for injecting and discharging, for example, cooled pure-water. The coolant passage 755 is formed so as to extend from the coolant inlet 759 to the coolant outlet 761 through the inside of the annular attachment block 753. With the structure mentioned above, it becomes possible to cool the hollow packing 751 from its root side. Therefore, it is possible to prevent the packing from overheating, thereby improving the life span.

Note, the packings and the sealing mechanisms shown in FIGS. 20 to 28 are also applicable to the sealing mechanisms shown in FIGS. 5 to 19, properly.

Next, processing-fluid supplying means of the cleaning-and-drying system will be described with reference to the FIGS. 2, 3A, 3B and 4.

The chemical (e.g. polymer stripper) supply means 50 has a chemical nozzle 51 attached to the inner cylinder 25, a chemical supply part 52, a pump 54 interposed in a chemical pipe line 53 connecting the nozzle 51 with the part 52, a filter 55, a heat regulator 56 and a chemical supply valve 57. Then, the chemical supply part 52 is formed by a chemical source 58, a chemical tank 52a for storing new chemical liquid supplied from the chemical source 58 and a circulation tank 52b for storing the chemical liquid supplied for processing. At the lowermost part of the inner chamber 23, on its expanded side, a first drain port 41 is arranged and connected to a first drain pipe 42 associated with both chemical tanks 52a, 52b. The first drain pipe 42 is connected to a circulation pipeline 90 through a not-shown switching valve (switching means). Note, at the uppermost part of the inner chamber 23, on its expanded side, a first exhaust port 43 is arranged and connected to a first exhaust pipe 44 interposing a not-shown closing valve therein. Temperature control heaters 52c are respectively disposed outside the supply tanks 52a, 52b to maintain the chemical liquids in the tanks 52a, 52b at designated temperatures. In order to allow the chemical liquid to be uniformly supplied to the whole wafers W as a plural, for example, twenty-five wafers, which are carried by the rotor 21, the chemical nozzle 51 is constituted as one shower nozzle having twenty-six orifices (not shown) outside the outermost wafers W and also between the adjoining wafers W. Also, the nozzle 51 is adapted so as to eject the chemical liquid through the respective orifices in substantial fan-shaped pattern. That is, since the chemical liquid is supplied, through the respective orifices of the nozzle 51, to the wafers W rotating together with the rotor 21, it is possible to uniformly supply the chemical liquid to the plural (e.g. 25 pieces) wafers W carried by the rotor 21. In the above-mentioned arrangement, the wafers are retained in the rotor 21 at the same intervals as those in case that twenty-five pieces of wafers W are accommodated in the carrier 1. Nevertheless, it should be assumed that the rotor 21 may retain, for example, fifty pieces of wafers at the half intervals of the intervals when accommodating the wafers in the carrier. Then, the nozzle orifices are fifty-one in number.

Figure 4:
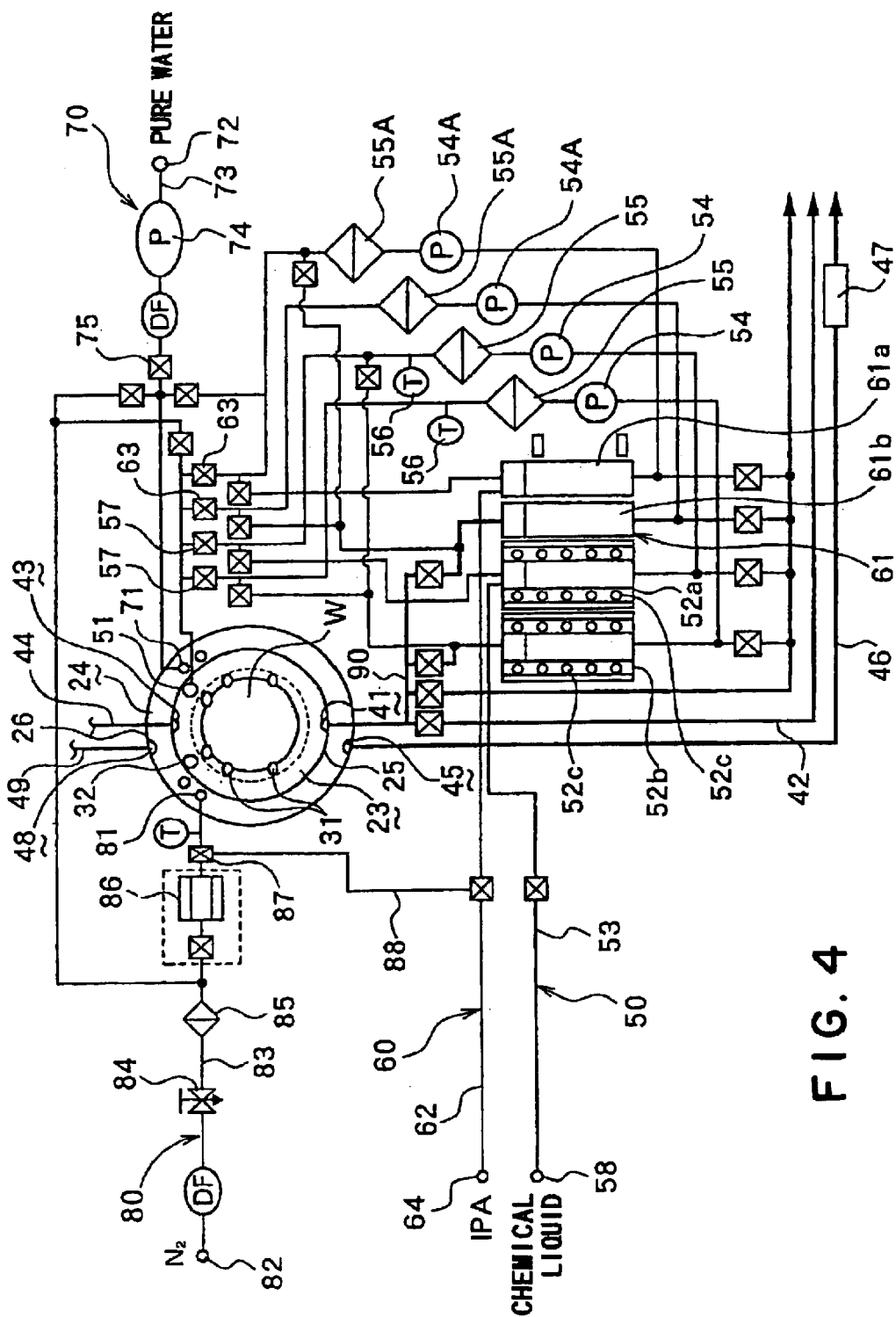
FIG. 4 is a schematic piping diagram showing a piping system of the processing apparatus of the present invention.

As shown in FIG. 4, the supply means 60 of chemical's solvent, such as IPA liquid, includes the supply nozzle 51 also serving as the above chemical nozzle attached to the inner cylinder 25, a solvent supply part 61, a pump 54A interposed in an IPA pipe line 62 connecting the nozzle 51 with the chemical supply part 52, a filter 55A and an IPA supply valve 63. Note, the supply nozzle 51 will be represented by "the chemical nozzle 51", hereinafter. Hereat, the above chemical's solvent indicates a liquid that does not react with the chemical liquid and also the rinsing liquid used in the subsequent process. Any solvent will do so long as the chemical liquid adhering to the wafers W and the chamber can be washed way in rough. In this case, the solvent supply part 61 comprises a solvent (e.g. IPA) source 64, an IPA supply tank 61a for storing a new IPA-liquid supplied from the IPA source 64 and a circulation supply tank 61b for storing IPA supplied for the processing. The circulation pipeline 90 is connected with both IPA supply tanks 61a, 61b through not-shown switching valves (switching unit). The circulation pipeline 90 is also connected to the first drain pipe 42 associated with the first drain port 41 in the lowermost part of the expanded side of the inner chamber 23.

While, as shown in FIGS. 2, 3A, 3B and 4, the supply means 70 for rinsing liquid (e.g. pure water) includes a pure-water nozzle 71 attached to the second stationary wall 38, a pure-water source 72, a supply pump 74 interposed in a pure-water pipeline 73 connecting the pure-water nozzle 71 with the source 72, and a pure-water supply valve 75. In this case, the pure-water nozzle 71 is positioned outside the inner chamber 23 and inside the outer chamber 24. With the arrangement, when the inner cylinder 25 retreats to the standby position and the outer cylinder 26 moves to the position to surround the rotor 21 and the wafers W thereby to define the outer chamber 24, then the nozzle 71 is positioned in the outer chamber 224 to supply the wafers W with the pure water.

The outer chamber 24 is provided, on its lower part of the expanded side, with a second drain port 45. The second drain port 45 is connected to a second drain pipe 46 through a closing valve (not shown). Interposed in the second drain pipe 46 is a specific resistance meter 47 that detects the specific resistance of pure water. Detecting the specific resistance of pure water supplied for the rinsing process, the specific resistance meter 47 further transmits its detection signal to the CPU 30. Thus, by monitoring the present rinsing situation by the specific resistance meter 47, it is possible to bring the rinsing operation to an end upon judgement of an appropriate rinsing.

In the upper part on the expanded side of the outer chamber 24, there is provided a second exhaust port 48 to which a second exhaust pipe 49 is connected through a not-shown closing valve.

As shown in FIGS. 2, 3A, 3B and 4, the dry-fluid supply means 80 comprises a dry-fluid nozzle 81 fixed on the second stationary wall 38, a dry fluid (e.g. $N_2$) source 82, a closing valve 84 interposed in a dry-fluid pipeline 83 connecting the nozzle 81 with the source 82, a filter 85 and a $N_2$-temperature regulator 86. On the secondary side of the regulator 86, the pipeline 83 is also connected with a branch pipeline 88 diverged from the IPA pipeline 62, through a switching valve 87. In this case, as similar to the pure-water nozzle 71, the dry-fluid nozzle 81 is positioned outside the inner chamber 23 and also inside the outer chamber 24. When the inner cylinder 25 retreats to the stand-by position and further the outer cylinder 26 moves to the position to surround the rotor 21 and the wafers W thereby to define the outer chamber 24, the dry-fluid nozzle 81 is positioned in the outer chamber 24 to supply the wafers W with a mixture of $N_2$-gas and IPA in mist. After drying the wafers W by the mixture of $N_2$-gas and IPA, it is carried out to dry the wafers by $N_2$-gas only. Although the dry fluid is identical to the mixture of $N_2$-gas and IPA in the above description, it may be replaced with only $N_2$-gas in the modification.

In the chemical supply means 50, the IPA supply means 60, the pure-water supply means 70 and the dry-fluid supply means 80, it is noted that respective operations of the pumps 54 and 54A, the heat regulator 56, the $N_2$-temperature regulator 86, the chemical supply valve 57, the IPA supply valve 63 and the switching valve 87 are controlled by the CPU 30 (see FIG. 2).

Note, the processing apparatus 20 constructed above is arranged in a processing space where cleaned air is always supplied downward through a filter unit (not shown).

Next, the operation of the above cleaning/drying apparatus will be described. First of all, as shown in FIG. 1, it is carried out to transport the carrier 1, which has the unprocessed wafers W accommodated therein and which has been loaded into the carrier loading part 2a of the loading/unloading part 2, to the carrier mount 7 by the carrier transfer means 8. Next, the wafer transfer chuck 10 moves above the carrier mount 7 to unload the wafers W from the carrier 1 and successively transfers the wafers W to the upside of the processing apparatus 20 in the processing part 3, in other words, the upside of the rotor 21 under condition that the inner cylinder 25 and the outer cylinder 26 are withdrawn to the standby positions. Then, the wafer delivery hand 29 rises to receive the wafers W transported by the wafer transfer chuck 10. Next, the hand 29 falls to deliver the wafers W onto the immovable carrying rods 31 of the rotor 21 and thereafter, the hand 29 returns to the initial position. After delivering the wafers W onto the immovable carrying rods 31, the wafer pusher rods 32 move to respective upper edges of the wafers W to hold the upper parts of the wafers W (see FIG. 21), by not-shown locking means.

Once the wafers W are set on the rotor 21 in the above way, as shown in FIG. 3A, the inner cylinder 25 and the outer cylinder 26 move to the position to surround the rotor 21 and the wafers W, so that the wafers W are accommodated in the inner chamber 23. Note, when the inner cylinder 25 and the outer cylinder 16 move, the sealing members 40a to 40d of the sealing mechanisms 40, 40A to 40K, that is, the hollow packings 100, 101 and the deformable hollow packings 130, 130A, 130B are under the non-sealing state with no contact with the first stationary wall 34, the second stationary wall 38, etc. After the inner cylinder 25 and the outer cylinder 16 are moved, the hollow packings 100, 101 and the deformable hollow packings 130, 130A, 130B of the sealing mechanisms 40, 40A to 40K are under the sealing state.

In the sealing state of the sealing mechanisms 40, 40A to 40K, the wafers W is supplied with the chemical liquid for the chemical processing. In this chemical processing, it is carried out to supply the chemical liquid for a predetermined period, e.g. dozens of seconds while rotating the rotor 21 and the wafers W at a low speed (e.g. 1 to 500 rpm) and thereafter, the supply of the chemical liquid is stopped. Next, the rotor 21 and the wafers W are rotated at a high speed (e.g. 100 to 3000 rpm) for several seconds to shake off the chemical liquid adhering to the surfaces of the wafer W. The chemical supply process and chemical shaking process are repeated by several times to thousands of times for completion of the chemical processing. Note, in the sealing state of the sealing mechanisms 40, 40A to 40K, the sealing state of the hollow packings 100, 101 and also the deformable hollow packings 130, 130A, 130B is monitored by the pressure-detecting switch 110, the gas sensor 111, etc. Accordingly, if the hollow packings 100, 101 and also the deformable hollow packings 130, 130A, 130B are broken or deteriorated in sealing effect, such a situation can be detected by CPU 400.

In the above-mentioned chemical process, the chemical liquid stored in the circulation tank 52b is firstly supplied. Then, this chemical liquid for the first use is thrown away through the first drain pipe 42. On and after the next process, the chemical liquid stored in the circulation tank 52b is supplied for circulation. At the end of the chemical process, new chemical liquid, which has been supplied from the source 58 into the chemical tank 52a, is used to finish the chemical process.

During this chemical process, the chemical liquid on supply for this process is collected to the first drain port 41 and discharged into the circulating pipeline 90 or the first drain pipe 42 of the chemical supply part 52 owing to the operation of a switching valve (not shown). While, gas from the chemical liquid is discharged from the first exhaust pipe 44 via the first exhaust port 43.

After completing the chemical process, it is started to supply the wafers W with IPA on condition that the wafers W are accommodating in the inner chamber 23. In this process, while rotating the rotor 21 and the wafers W at a low speed, for example, 1 to 500 rpm, the IPA liquid is first supplied through the chemical nozzle 51 also serving as the IPA nozzle for the IPA supply unit 60, for a predetermined period (e.g. dozens of seconds) and thereafter, the supply of IPA liquid is stopped. Subsequently, the rotor 21 and the wafers W are rotated at a high speed, e.g. 100 to 3000 rpm for several seconds in order to shake and remove the IPA liquid adhering to the surfaces of the wafers W. This chemical removal process is completed by the repetition of both IPA-supply process and IPA-removal process from several times to thousands of times. Also in this chemical removal process, the IPA liquid on the first supply is identical to a chemical liquid stored in the circulation tank 61b, as similar to the previously-mentioned chemical process. Then, this IPA liquid on the first use is thrown away through the first drain pipe 42. On and after the next process, the IPA liquid stored in the circulation tank 61b is supplied for circulation. At the end of the chemical removing process, new IPA liquid, which has been supplied from the IPA source 64 into the supply tank 61a, is used to finish the chemical removal process.

Note, at the chemical removal process, the IPA liquid supplied for this process is collected to the first drain port 41 and discharged into the circulation pipe line 90 or the first drain pipe 42 of the solvent supply part 61 owing to the operation of the switching valve (not shown). While, the IPA gas is discharged from the first exhaust pipe 44 through the first exhaust port 43.

After completing the chemical process and the sequent rinsing process, on establishment of non-sealing condition of the hollow packings 100, 101 and also the deformable hollow packings 130, 130A, 130B of the sealing mechanisms 40, 40A to 40K, the inner cylinder 25 is withdrawn to the standby position, so that the rotor 21 and the wafers W are surrounded by the outer cylinder 26. In other words, the wafers W are accommodated in the outer chamber 24. Consequently, if liquid drops from the wafers W processed in the inner chamber 23, it is possible to catch such droplets by the outer chamber 24. In the above condition, the rinsing liquid (e.g. pure water) is firstly supplied to the rotating wafers W through the pure-water nozzle 71 of the rinsing-liquid supply means. The pure water supplied in the rinsing process and the removed IPA liquid are discharged from the second drain pipe 46 via the second drain port 45. Further, gas produced in the outer chamber 24 is discharged from the second exhaust pipe 49 to the outside through the second exhaust port 48.

After completing the rinsing process for a predetermined period in the above way, the mixture-fluid of $N_2$-gas and IPA is supplied from the gas source 82 and the IPA source 64 into the rotating wafers W. In this way, it is possible to remove the pure water sticking to the wafers' surfaces and dry the wafers W and the outer chamber 24. Further, by further supplying only $N_2$-gas to the wafers W subsequently to the drying process using the mixture of $N_2$-gas and IPA, the drying of the wafers W and the outer chamber 24 can be progressed more effectively.

Upon completion of the chemical process, the chemical removal process, the rinsing process and the drying process for the wafers W, the sealing mechanisms 40, 40A to 40K of the third and fourth sealing members 40c, 40d are brought into the non-sealing condition and further, the outer cylinder 26 retreats to the standby position on the outside of the inner cylinder 25, while the wafer pusher rods 32 are withdrawn from their wafer-holding position with the operation of a not-shown delocking unit. Then, the wafer delivery hand 29 is elevated to receive the wafers W carried by the immovable carrying rods 31 and thereafter, the hand 29 moves to the upside of the processing apparatus 20. Next, the wafers W brought into the upside of the processing apparatus are received by the wafer transfer chuck 10 to transport them to the interface part 4 where the wafers are loaded into the carrier 1 on the carrier mount 7. In this way, the carrier 1 with the processed wafers W is transported to the carrier unloading part 2b by the carrier transfer means 8 and thereafter, the carrier 1 is discharged outside the apparatus.

Although the above embodiments have been described by example of the chemical liquid (chemicals) process, the IPA process, the pure water process and the drying process, of course, the present invention is applicable to other processes so long as performing them in the closed atmosphere closing both of the processing chamber and the closing means.

Further, although the sealing mechanisms 40, 40A to 40K in the above embodiments are respectively applied to the processing apparatus having the first stationary wall 34 and the second stationary wall 38 as the closing means for the inner cylinder 15 and the outer cylinder 26 forming the processing chamber, of course, the mechanisms are applicable to the other processing apparatus, for example, a processing apparatus having, as the closing means, a lid body movable forward and backward to the processing chamber.

Also, although the sealing mechanisms 40, 40A to 40K in the above-mentioned embodiments are respectively directed to the processing under the circumference with high-temperature atmosphere, they may be applied in case of processing the wafers under the circumference with low-temperature atmosphere similarly. In this case, if there is provided a heat regulator 500 (500A) which adjusts the temperature of pressurized fluids (air, pure water) higher than or equal to a temperature of the interior of the processing chamber, then it is possible to make both expansion and contraction of the hollow packings 100, 101 and the deformable hollow packings 130, 130A, 130B appropriately. Note, the reason for equalization in temperature between the pressurized fluids (air, pure water) and the interior of the processing chamber is because such an establishment would have no influence on the interior of the processing chamber so as not to hinder the processing.

Although both processing apparatus and method of the present invention are applied on the cleaning/drying apparatus for semiconductor wafers in the above-mentioned embodiments, of course, the present invention is also applicable to not only another processing apparatus which requires the sealing mechanism (e.g. apparatus employing other processing liquids, apparatus utilizing reactive gas, etc.) but apparatus for processing other substrates, such as LCD glass substrates, besides the semiconductor wafers.

In above embodiments, the heat-regulating sealing mechanisms of the present invention are applied to the processing apparatus where the processing fluids (chemical liquids, IPA, pure water, etc.) are brought into contact with the wafers W (objects to be processed) in the processing chamber sealed up by the closing means; nevertheless the same mechanisms are also applicable to the other processing apparatus.

Next, one application of the above-mentioned sealing mechanisms 40, 40A to 40K and the packings on the other cleaning/drying apparatus will be described with reference to FIGS. 29 and 30.

Figure 29:
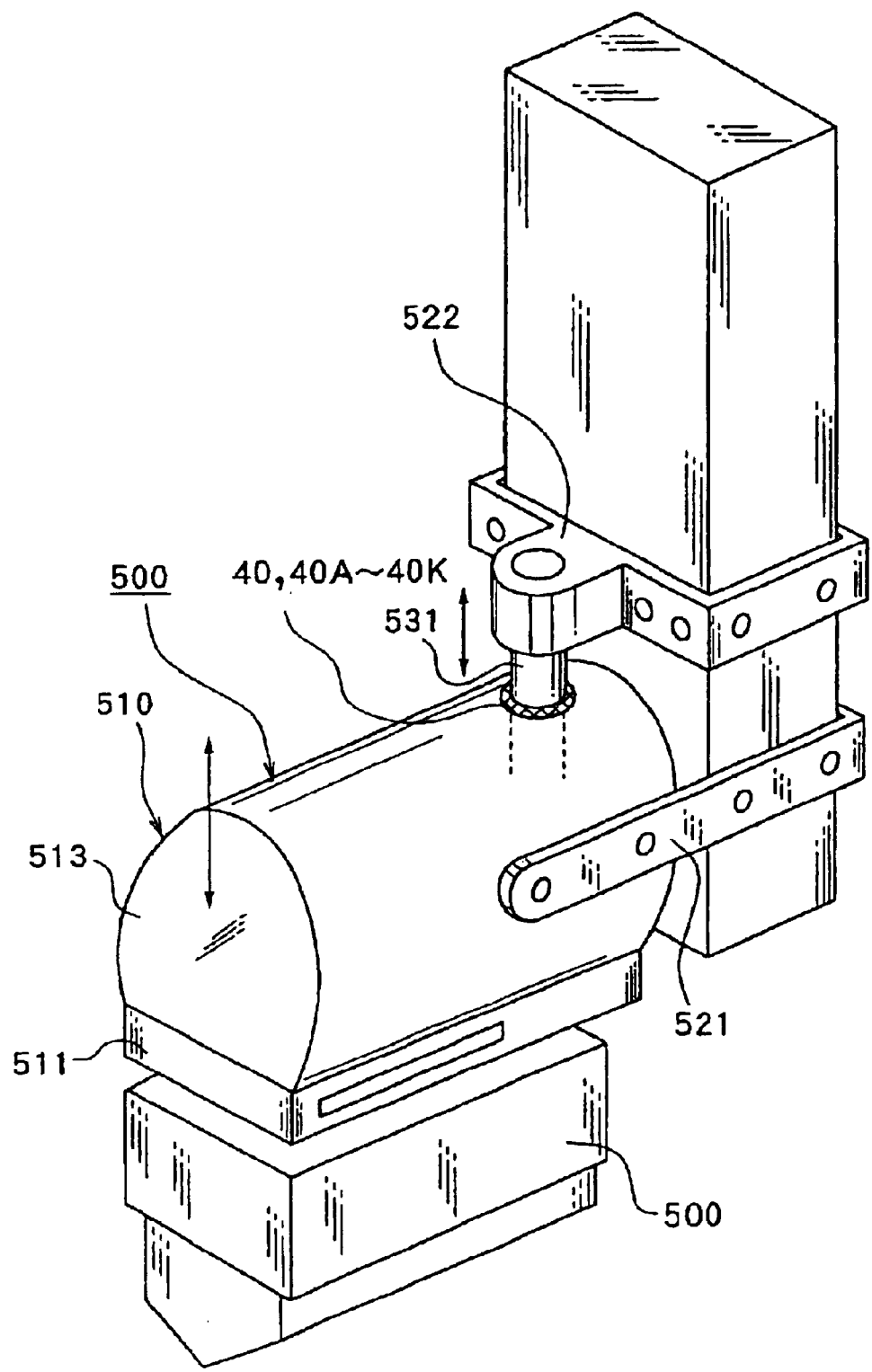
FIG. 29 is a perspective view of the other cleaning and drying apparatus on which the sealing mechanism of the invention is applied.
Figure 30:
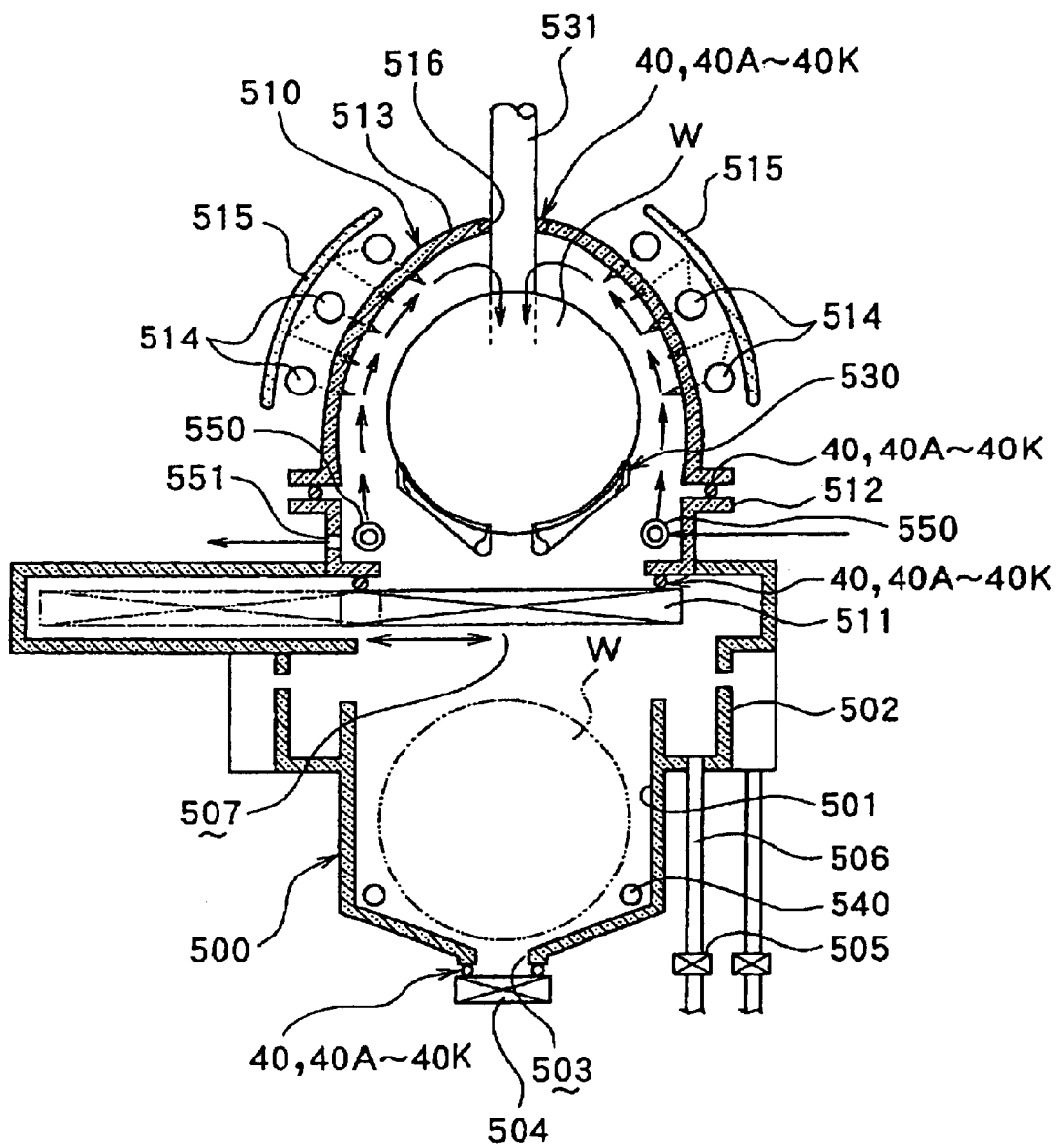
FIG. 30 is a schematic sectional view of the cleaning and drying apparatus with the sealing mechanism of FIG. 29.

As shown in FIGS. 29 and 30, this cleaning/drying apparatus mainly comprises a cleaning bath 500 for reserving (storing) the chemical liquid (e.g. hydrogen fluoride acid) or the cleaning liquid (e.g. pure water) to dip the wafers W therein, a drying chamber 510 positioned above the cleaning bath 500 and carrying means (e.g. a wafer boat 530) for carrying the wafers W as a plural (e.g. fifty pieces) to deliver them between the cleaning bath 500 and the drying chamber 510.

In the arrangement, the cleaning bath 500 includes an inner bath 501 made from silica member, polypropylene, etc. and an outer bath 502 arranged outside the upper part of the inner bath 501 to receive the cleaning liquid overflowing out of the inner bath 501. The inner bath 501 is provided, on both sides of its lower part, with cleaning-liquid nozzles 540 for ejecting the cleaning liquid to the wafers W in the cleaning bath 500. In operation, the chemical liquid or pure water is stored in the cleaning bath 500. The chemical liquid or pure water is supplied from not-shown chemical source or pure-water source connected to the cleaning-liquid nozzles 540 through a switching valve. On the bottom of the inner bath 501, it has an opening 503 capable of discharging the chemical liquid or pure water. Through the sealing mechanism 40, 40A to 40K, a closing lid 504 (closing means) is attached to the opening 503 so as to open and close it. Note, the outer bath 502 is provided, on its bottom part, with a drain port connected with a drain pipe 506 having an drain valve 505 therein.

The drying chamber 510 includes a fixed base 512 communicating with an opening 507 of the cleaning bath 500 through a shutter 511, and a drying-chamber body 513 closely fitted to the fixed base 512 through the sealing mechanism 40, 40A to 40K. Note, the sealing mechanism 40, 40A to 40K is also interposed between the shutter 511 and the fixed base 512. The drying-chamber body 513 is made from a silica member having a reverse-U shaped section and the fixed base 512 is also made from the silica member, allowing the condition of the wafers W to be visible from the outside. On the lateral side of the fixed base 512 forming the drying chamber 510, there are provided dry-gas supply parts 550 for supplying the dry gas, such as IPA vapor, from the lateral side of the chamber toward the upside, and a dry-gas discharge part 551 for discharging the dry gas. The dry-gas supply parts 550 are connected with a not-shown IPA-gas generator and a not-shown heater for heating a carrier (e.g. $N_2$-gas) for feeding the dry gas compressively. The dry-gas discharge part 551 is connected with a not-shown exhaust unit. In this way, owing to the provision of the dry-gas supply parts 550 and the dry-gas discharge part 551, the dry gas supplied into the drying chamber 510 through the dry-gas supply parts 550 flows along the inner walls on both sides of the chamber body 513 upward. After that, the dry gas flows downward from the center of the drying chamber and is discharged from the dry-gas discharge part 551. Consequently, it is possible to make the wafers W contact with the dry gas uniformly, allowing of drying the wafers by the condensing-replacement of the dry-gas vapor.

On both sides of the drying-chamber body 513, there are heater lamps 514 (light source for heater) behind which reflecting plates 515 are arranged. With the arrangement of the heater lamps 514, it is possible to promote the drying of the wafers W in the drying chamber 510 since the drying chamber 510 is heated by light radiated from the heater lamps 514 directly or the same reflected on the reflecting plates 515. The drying-chamber body 513 is adapted so as to be movable up and down, in other words, close to and apart from the fixed base 512, by first elevating means 512.

Additionally, the wafer boat 530 is adapted so as to be movable up and down, in other words, movable in the cleaning bath 500 and also the drying chamber 510, by second elevating means 522. The wafer boat 530 has a rod 531 connected to the second elevating means 522 to slidably penetrate through a through-hole 516 (opening) at the top of the chamber body 513. On a sliding side of the rod 531 of the wafer boat 530 in the through-hole 516, that is, between the through-hole 516 and the rod 531, there are provided the sealing mechanism 40, 40A to 40K that ensures the leak-tightness between the through-hole 516 and the rod 531.

The above-mentioned cleaning/drying apparatus operates as follows.

First, when the shutter 511 is closed at the opening 507 of the cleaning bath 500 and subsequently the drying-chamber body 513 is elevated by the drive of the first elevating means 521 thereby to define a space above the cleaning bath 500, a transfer arm (not shown) having the wafers W moves sideways to load the wafers W into the space. At this time, with the drive of the second elevating means 522, the wafer boat 530 is elevated to receive the wafers W retained by the transfer arm. After the withdrawal of the transfer arm that has delivered the wafers W, the shutter 511 is opened and the wafer boat 530 is lowered to load the wafers W into the cleaning bath 500, owing to the drive of the second elevating means 522. Then, by the drive of the first elevating means 521, the drying-chamber body 513 is lowered to come into close contact with the fixed base 512. Note, the shutter 511 may be opened from the beginning.

Thereafter, the chemical liquid, for example, hydrogen fluoride acid is supplied from cleaning-liquid nozzles 540 to clean the wafers W in chemical. Note, the chemical liquid may be supplied to the cleaning bath 500 in advance. Next, the pure water is supplied from the cleaning-liquid nozzles 540 to clean the wafers with the replacement for the chemical liquid. After cleaning the wafers W, the second elevating means 522 is driven to raise the wafer boat 530, so that the wafers W are brought into the drying chamber 510. Simultaneously, the shutter 511 is closed to insulate the drying chamber 510 from the cleaning bath 500 and the air outside. Note, the shutter 511 may be closed during the processing of the wafers W in the cleaning bath 500.

Subsequently, the dry gas, for example, mixture gas of IPA and $N_2$ is supplied from the dry-gas supply part into the drying chamber 510 thereby to establish IPA-atmosphere therein, so that the wafers W come into contact with IPA for dry. Then, the dry gas is partially discharged from the dry-gas discharge part 551.

After replacing the water sticking to the wafers W by IPA or after the drying process is completed to supply $N_2$-gas from the dray-gas supply parts 550 thereby to remove the IPA-atmosphere from the drying chamber 510, the first elevating means 521 moves to raise the drying chamber 513, defining a space in the cleaning bath 500. Next, from the lateral side of the space, the transfer arm (not shown) moves to the underside of the wafer boat 530 in the space, while the wafer boat 530 is lowered by the second elevating means 522 thereby to deliver the wafers W to the transfer arm. On receipt of the wafers W, the transfer arm retreats from the upside of the cleaning bath 500 to transfer the wafers to the next process.

As mentioned above, owing to the formation of space the cleaning bath 500 by the rise of the drying-chamber body 513, it is possible to move the transfer arm laterally in order to deliver the wafers W. Therefore, in comparison with the conventional apparatus to deliver the wafers W through the upside of the drying chamber 510, it is possible to lower the apparatus in height and also possible to make the whole apparatus compact. Additionally, since the moving distance of the transfer arm is reduced, it is possible to shorten the moving period, improving throughput of the apparatus.

In the above cleaning/drying apparatus, the sealing mechanisms 40, 40A to 40K are arranged between the opening 503 on the bottom of the inner bath 501 and the closing lid 504, between the fixed base 512 and the shutter 511 at the opening 507 of the cleaning bath 500, between the fixed base 512 and the drying-chamber body 513, and also between the through-hole 516 of the drying-chamber body 513 and the rod 531 of the wafer boat 530, respectively. Thus, at the above four positions, the sealing mechanisms are capable of effecting their functions certainly. Additionally, if adopting any of the heat-regulating sealing mechanisms 40G to 40K, the temperature of pressurized fluid (air, pure water) supplied into the hollow packing 100 (or the deformable packing 130) can be adjusted so as to correspond to the temperature in the cleaning bath 500 or the temperature in the drying chamber 510. Thus, it is possible to improve the sealing capability of the hollow packing 100 (or the deformable packing 130) and also possible to increase the life of the packing.

As to the form to supply the pressurized fluid (air, pure water) to the respective parts at the four positions, the pressurized fluid (air, pure water) on the adjustment in temperature may be supplied from the identical pressurized-fluid source (i.e. the air source 103, the pure-water source 621, etc.) into the hollow parts of the hollow packing 100 (or the deformable packing 130). Alternatively, by distinguishing between the cleaning bath 500 and the drying chamber 510, which are different from each other in terms of the circumference in temperature, the pressurized fluid (air, pure water) may be supplied to the chambers independently.

Although both processing apparatus and method of the present invention are applied on the cleaning/drying apparatus for semiconductor wafers in the above-mentioned embodiments, of course, the present invention is also applicable to not only another processing apparatus which requires the sealing mechanism (e.g. apparatus employing other processing liquids, apparatus utilizing reactive gas, etc.) but apparatus for processing other substrates, such as LCD glass substrates, besides the semiconductor wafers.

What is claimed is:

1. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with flexible hollow sealing members in a duplex arrangement; and a source of pressurized fluid is connected to respective hollow parts of the hollow sealing members through a pressure detector and a closing valve so that all hollow parts of the hollow sealing members are supplied with pressurized fluid so as to seal the closing part at the same time.

2. A processing apparatus with sealing mechanism as claimed in claim 1, wherein the source of pressurized fluid is adapted so as to supply a gas source.

3. A processing apparatus with sealing mechanism as claimed in claim 1, wherein the source of pressurized fluid is adapted so as to supply a cooling water; and the hollow parts of the hollow sealing members are connected with a drain pipe.

4. A processing apparatus with sealing mechanism as claimed in claim 3, wherein the drain pipe is provided with a closing valve and a flow regulator in parallel.

5. A processing apparatus with sealing mechanism as claimed in claim 1, wherein an interval between the hollow sealing members in the duplex arrangement is connected with an exhaust device through a leakage detector.

6. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with deformable hollow sealing members arranged doubly which are deformable against the processing container body or the closing member; and the deformable hollow sealing members have hollow parts which are respectively connected to a closing switching valve and a pressure regulator so that all hollow parts of the hollow sealing members are supplied with fluid so as to seal the closing part at the same time.

7. A processing apparatus with sealing mechanism as claimed in claim 6, wherein the pressure regulator is identical to a gas source.

8. A processing apparatus with sealing mechanism as claimed in claim 6, wherein the pressure regulator is identical to a suction device.

9. A processing apparatus with sealing mechanism, comprising a processing container having a processing container body with an opening and a closing member for closing the opening, the processing container defining a processing chamber therein, and also making an object to be processed that is positioned in the processing chamberer contact a processing fluid thereby processing the object, wherein either one of the processing container body and the closing member is provided, at a closing part formed between the processing container body and the closing member, with flexible hollow sealing members; and a source of pressurized fluid is connected to a hollow part of the hollow sealing members through a fluid pipeline interposing a heat regulator for pressurized fluid so that all hollow parts of the hollow sealing members are supplied with pressurized fluid so as to seal the closing part at the same time.

10. A processing apparatus with sealing mechanism as claimed in claim 9, wherein a pressure detector and a closing valve are interposed in the fluid pipeline.

11. A processing apparatus with sealing mechanism as claimed in claim 9, wherein the source of pressurized fluid is adapted so as to supply a gas source.

12. A processing apparatus with sealing mechanism as claimed in claim 9, wherein the source of pressurized fluid is formed by a liquid supply source; and a drain pipe is connected with the hollow part of the hollow sealing member.

13. A processing apparatus with sealing mechanism as claimed in claim 12, wherein the drain pipe has a closing valve and a flow regulator interposed in parallel.

14. A processing apparatus with sealing mechanism, comprising a processing container having a processing container body with an opening capable of discharging a processing fluid and a closing member for closing the opening, the processing container defining a processing chamber therein, and also making an object to be processed that is positioned in the processing chamber contact the processing fluid thereby processing the object, wherein either one of the processing container body and the closing member is provided, at a closing part formed between the processing container body and the closing member, with a flexible hollow sealing member; and a source of pressurized fluid is connected to respective hollow parts of the hollow sealing member through a fluid pipeline interposing a heat regulator for pressurized fluid so that all hollow parts of the hollow sealing member are supplied with pressurized fluid so as to seal the closing part at the same time.

15. A processing apparatus with sealing mechanism, comprising a processing container having a processing container body with an opening capable of loading and unloading an object to be processed and a closing member for closing the opening, the processing container defining a processing chamber therein, and also making the object that is positioned in the processing chamber contact a processing fluid thereby processing the object, wherein either one of the processing container body and the closing member is provided, at a closing part formed between the processing container body and the closing member, with flexible hollow sealing members; and a source of pressurized fluid is connected to respective hollow parts of the hollow sealing members through a fluid pipeline interposing a heat regulator for pressurized fluid so that all hollow parts of the hollow sealing members are supplied with pressurized fluid so as to seal the closing part at the same time.

16. A processing apparatus with sealing mechanism, comprising a processing container having an opening, a holder for holding an object to be processed in a processing chamber defined in the processing container, and a rod provided, at an end thereof, with the holder and also slidably inserted into the opening, and also making the object held by the holder contact a processing fluid thereby processing the object, wherein a flexible hollow sealing member is arranged on the processing container sliding with respect to the rod; and a source of pressurized fluid is connected to a hollow part of the hollow sealing member through a fluid pipeline interposing a heat regulator for pressurized fluid.

17. A processing apparatus with sealing mechanism, comprising a processing container having a processing container body with an opening and a closing member for closing the opening, the processing container defining a processing chamber therein, and also making an object to be processed that is positioned in the processing chamber, to contact a processing fluid thereby processing the object, wherein either one of the processing container body and the closing member is provided, at a closing part formed between the processing container body and the closing member, with a flexible hollow sealing member; and the hollow sealing member includes an outer sealing member having flexibility with a hollow part and an inner sealing member arranged in the hollow part of the outer sealing member to also have flexibility with a hollow part; and the hollow part of the outer sealing member and the hollow part of the inner sealing member are connected with a source of pressurized fluid through a fluid pipeline.

18. A processing apparatus with sealing mechanism as claimed in claim 17, wherein at least the hollow part of the outer sealing member is supplied with cooled pressurized fluid.

19. A processing apparatus with sealing mechanism as claimed in claim 17, wherein the hollow part of the inner sealing member and the hollow part of the outer sealing member are supplied with pressurized fluids of the same pressure.

20. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with flexible hollow sealing members in a duplex arrangement;

a source of pressurized fluid is connected to respective hollow parts of the hollow sealing members through a pressure detector and a closing valve and is adapted so as to supply a cooling water; and the hollow parts of the hollow sealing members are connected with a drain pipe.

21. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with flexible hollow sealing members in a duplex arrangement;

a source of pressurized fluid is connected to respective hollow parts of the hollow sealing members through a pressure detector and a closing valve and is adapted so as to supply a cooling water;

the hollow parts of the hollow sealing members are connected with a drain pipe; and the drain pipe is provided with a closing valve and a flow regulator in parallel.

22. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with flexible hollow sealing members in a duplex arrangement;

a source of pressurized fluid is connected to respective hollow parts of the hollow sealing members through a pressure detector and a closing valve; and an interval between the hollow sealing members in the duplex arrangement is connected with an exhaust device through a leakage detector.

23. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with a flexible hollow sealing member;

a source of pressurized fluid is connected to a hollow part of the hollow sealing member through a fluid pipeline interposing a heat regulator for pressurized fluid and is formed by a liquid supply source; and a drain pipe is connected with the hollow part of the hollow sealing member.

24. A processing apparatus with sealing mechanism, comprising a processing container having a processing container body with an opening and a closing member for closing the opening, the processing container defining a processing chamber therein, and also making an object to be processed that is positioned in the processing chamber contact a processing fluid thereby processing the object, wherein either one of the processing container body and the closing member is provided, at a closing part formed between the processing container body and the closing member, with a flexible hollow sealing member; and a source of pressurized fluid is connected to a hollow part of the hollow sealing member through a fluid pipeline interposing a heat regulator for pressurized fluid and is formed by a liquid supply source; and a drain pipe is connected with the hollow part of the hollow sealing member and has a closing valve and a flow regulator interposed in parallel.

* * * * *